(12) United States Patent
Peng

(10) Patent No.: US 12,332,333 B2
(45) Date of Patent: Jun. 17, 2025

(54) ACCELERATING MAGNETIC RESONANCE IMAGING USING PARALLEL IMAGING AND ITERATIVE IMAGE RECONSTRUCTION

(71) Applicant: Neuro42 Inc., San Francisco, CA (US)

(72) Inventor: Haidong Peng, San Francisco, CA (US)

(73) Assignee: neuro42, Inc., San Francisco, CA (US)

( * ) Notice: Subject to any disclaimer, the term of this patent is extended or adjusted under 35 U.S.C. 154(b) by 71 days.

(21) Appl. No.: 18/153,111

(22) Filed: Jan. 11, 2023

(65) Prior Publication Data

US 2024/0230811 A1     Jul. 11, 2024

(51) Int. Cl.
| | | |
|---|---|---|
| G01V 3/00 | (2006.01) | |
| G01R 33/54 | (2006.01) | |
| G01R 33/565 | (2006.01) | |
| G06T 11/00 | (2006.01) | |

(52) U.S. Cl.
CPC ......... *G01R 33/565* (2013.01); *G01R 33/543* (2013.01); *G06T 11/005* (2013.01); *G06T 2211/424* (2013.01)

(58) Field of Classification Search
CPC .............. G01R 33/3415; G01R 33/543; G01R 33/5659; G01R 33/36; A61B 5/055
USPC ........................................................ 324/309
See application file for complete search history.

(56) References Cited

U.S. PATENT DOCUMENTS

| | | | |
|---|---|---|---|
| 2019/0197674 A1 | 6/2019 | Bai et al. | |
| 2021/0124003 A1* | 4/2021 | Lazarus | G01R 33/445 |
| 2024/0168105 A1 | 5/2024 | Inglis et al. | |
| 2024/0215849 A1 | 7/2024 | Lin et al. | |
| 2024/0215927 A1 | 7/2024 | Lin | |
| 2024/0219504 A1 | 7/2024 | Lin et al. | |
| 2024/0230804 A1 | 7/2024 | Zou | |

FOREIGN PATENT DOCUMENTS

| | | | | |
|---|---|---|---|---|
| CN | 106597333 A | * | 4/2017 | ............. A61B 5/055 |
| EP | 3730964 A1 | * | 10/2020 | ......... G01R 33/4818 |
| WO | WO-2020142109 A1 | * | 7/2020 | ............. A61B 5/055 |

(Continued)

OTHER PUBLICATIONS

JP 2017509411 A (No Name) (Year: 2017).*

(Continued)

*Primary Examiner* — Walter L Lindsay, Jr.
*Assistant Examiner* — Frederick Wenderoth
(74) *Attorney, Agent, or Firm* — Wilson Sonsini Goodrich & Rosati

(57) ABSTRACT

The present disclosure provides various systems and methods for magnetic resonance imaging. In one aspect, a method for magnetic resonance imaging can include receiving k-space data sets acquired by radiofrequency (RF) coils. Each of the k-space data sets can correspond to a different one of the RF coils. Each of the k-space data sets can be truncated and/or under sampled. The method can further include generating partial images of a field of view based on the k-space data sets and generating an initial image based on the partial images. The initial image can be full image of the field of view. The method can further include applying an iterative image reconstruction technique to generate an updated image based on the initial image.

19 Claims, 11 Drawing Sheets

(56) References Cited

FOREIGN PATENT DOCUMENTS

| WO | WO-2022236308 A1 | 11/2022 |
| WO | WO-2024151727 A1 | 7/2024 |

OTHER PUBLICATIONS

KR 20190086390 A (Park) (Year: 2019).*

Cooley, Clarissa Zimmerman et al. Design Of Sparse Halbach Magnet Arrays For Portable MRI Using A Genetic Algorithm. IEEE Transactions on Magnetics 54(1):5100112, 1-12 (2018). Published online Oct. 23, 2017.

Feng, L. et al. Combination of Compressed Sensing, Parallel Imaging and Partial Fourier for Highly-Accelerated 3D First-Pass Cardiac Perfusion MRI. Proc Intl Soc Mag Reson Med 19:4368 (2011).

Griswold, Mark A. et al. Generalized Autocalibrating Partially Parallel Acquisitions (GRAPPA). Magnetic Resonance in Medicine 47(6):1202-1210 (2002).

IEEE Standard for Information technology—Telecommunications and information exchange between systems—Local and metropolitan area networks—Specific requirements Part 3: Carrier Sense Multiple Access with Collision Detection (CSMA/CD) Access Method and Physical Layer Specifications. IEEE Standard 802.3:1-2977 (2008).

Pauly, John. Partial k-Space Recconstruction, Lecture Notes. FMRIB Centre, University of Oxford 1-11 (2005).

PCT/US2024/011039 International Search Report and Written Opinion dated Apr. 23, 2024.

Pruessmann, Klaas P. et al. SENSE: Sensitivity Encoding for Fast MRI. Magnetic Resonance in Medicine 42(5):952-962 (1999).

The ATM Forum Technical Committee. ATM-MPLS Network Interworking Version 2.0, Aug. 2003; [retrieved on Aug. 20, 2024]. Available at URL:https://www.broadband-forum.org/download/af-aic-0178.001.pdf pp. 1-34.

* cited by examiner

ACCELERATING MAGNETIC RESONANCE IMAGING USING PARALLEL IMAGING AND ITERATIVE IMAGE RECONSTRUCTION

BACKGROUND

The present disclosure relates to magnetic resonance imaging (MRI), medical imaging, medical intervention, and surgical intervention. MRI systems often include large and complex machines that generate significantly high magnetic fields and create significant constraints on the feasibility of certain surgical interventions. Restrictions can include limited physical access to the patient by a surgeon and/or a surgical robot and/or limitations on the usage of certain electrical and mechanical components in the vicinity of the MRI scanner. Such limitations are inherent in the underlying design of many existing systems and are difficult to overcome.

SUMMARY

According to one aspect, the present disclosure provides a method for magnetic resonance imaging. The method can include receiving k-space data sets acquired by radiofrequency (RF) coils of a RF coil assembly. Each of the k-space data sets can correspond to a different one of the RF coils. Each of the k-space data sets can be truncated and/or under sampled. The method can further include generating partial images of a field of view based on the k-space data sets. Each of the partial images can correspond to a different one of the k-space data sets. The method can further include generating an initial image based on the partial images. The initial image is full image of the field of view. The method can further include applying an iterative image reconstruction technique to generate an updated image based on the initial image.

In some aspects, applying the iterative image reconstruction technique to generate the updated image based on the initial image can include designating the initial image as an input image. Applying the iterative image reconstruction technique can further include applying a phase correction to the input image to generate a first intermediate image, applying a k-space conjugate synthesis to the input image to generate a second intermediate image, and calculating an output image based on the first intermediate image and the second intermediate image. The output image can be designated as the input image for a next iteration. Applying the iterative image reconstruction technique can further include repeating the applying the phase correction to the input image, the applying the k-space conjugate synthesis to the input image, the calculating the output image, and the designating the output image as the input image for the next iteration. The updated image can be generated based on a final output image of the iterative image reconstruction technique.

According to another aspect, the present disclosure provides a system. The system can include an array of magnets, a radio frequency (RF) coil assembly, and a control circuit. The array of magnets can be configured to generate a low-field strength or ultra-low-field strength magnetic field toward an object of interest located within a field of view. The RF coil assembly can include an array of RF coils. The RF coils can be positionable around an object of interest in the field of view. The RF coils can be configured to acquire magnetic resonance signals. The control circuit can include a processor and a memory. The memory can store instructions executable by the processor to receive k-space data sets corresponding to magnetic resonance signals acquired by the RF coils. Each of the k-space data sets can correspond to a different one of the RF coils. Each of the k-space data sets can be truncated and/or under sampled. The memory can further store instructions executable by the processor to generate partial images of the field of view based on the k-space data sets. Each of the partial images can correspond to a different one of the k-space data sets. The memory can further store instructions executable by the processor to generate an initial image based on the partial images, wherein the initial image is full image of the field of view, and apply an iterative image reconstruction technique to generate an updated image based on the initial image.

BRIEF DESCRIPTION OF THE DRAWINGS

The various aspects described herein, both as to organization and methods of operation, together with further objects and advantages thereof, may best be understood by reference to the following description, taken in conjunction with the accompanying drawings as follows.

Corresponding reference characters indicate corresponding parts throughout the several views. The exemplifications set out herein illustrate various disclosed embodiments, is one form, and such exemplifications are not to be construed as limiting the scope thereof in any manner.

DETAILED DESCRIPTION

Applicant of the present application owns the following patent application that was filed on even date herewith and which is each incorporated by reference herein in its entirety:
U.S. patent application, titled FAST T2-WEIGHTED AND DIFFUSION-WEIGHTED CHIRPED-CPMG SEQUENCES.

Applicant of the present application also owns the following patent applications, which are each herein incorporated by reference in their respective entireties:
International Patent Application No. PCT/US2022/72143, titled NEURAL INTERVENTIONAL MAGNETIC RESONANCE IMAGING APPARATUS, filed May 5, 2022;
U.S. patent application Ser. No. 18/057,207, titled SYSTEM AND METHOD FOR REMOVING ELECTROMAGNETIC INTERFERENCE FROM LOW-FIELD MAGNETIC RESONANCE IMAGES, filed Nov. 19, 2022;
U.S. patent application Ser. No. 18/147,418, titled MODULARIZED MULTI-PURPOSE MAGNETIC RESONANCE PHANTOM, filed Dec. 28, 2022;
U.S. patent application Ser. No. 18/147,542, titled INTRACRANIAL RADIO FREQUENCY COIL FOR INTRAOPERATIVE MAGNETIC RESONANCE IMAGING, filed Dec. 28, 2022; and
U.S. patent application Ser. No. 18/147,556, titled DEEP LEARNING SUPER-RESOLUTION TRAINING FOR ULTRA LOW-FIELD MAGNETIC RESONANCE IMAGING, filed Dec. 28, 2022.

Before explaining various aspects of neural interventional magnetic resonance imaging devices in detail, it should be noted that the illustrative examples are not limited in application or use to the details of construction and arrangement of parts illustrated in the accompanying drawings and description. The illustrative examples may be implemented or incorporated in other aspects, variations and modifications, and may be practiced or carried out in various ways. Further, unless otherwise indicated, the terms and expressions employed herein have been chosen for the purpose of describing the illustrative examples for the convenience of the reader and are not for the purpose of limitation thereof. Also, it will be appreciated that one or more of the following-described aspects, expressions of aspects, and/or examples, can be combined with any one or more of the other following-described aspects, expressions of aspects and/or examples.

Various aspects are directed to neural interventional magnetic resonance imaging (MRI) devices that allows for the integration of surgical intervention and guidance with an MRI. This includes granting physical access to the area around the patient as well as access to the patient's head with one or more access apertures. In addition, the neural interventional MRI device may allow for the usage of robotic guidance tools and/or traditional surgical implements. In various instances, a neural interventional MRI can be used intraoperatively to obtain scans of a patient's head and/or brain during a surgical intervention, such as a surgical procedure like a biopsy or neural surgery.

Figure 1:
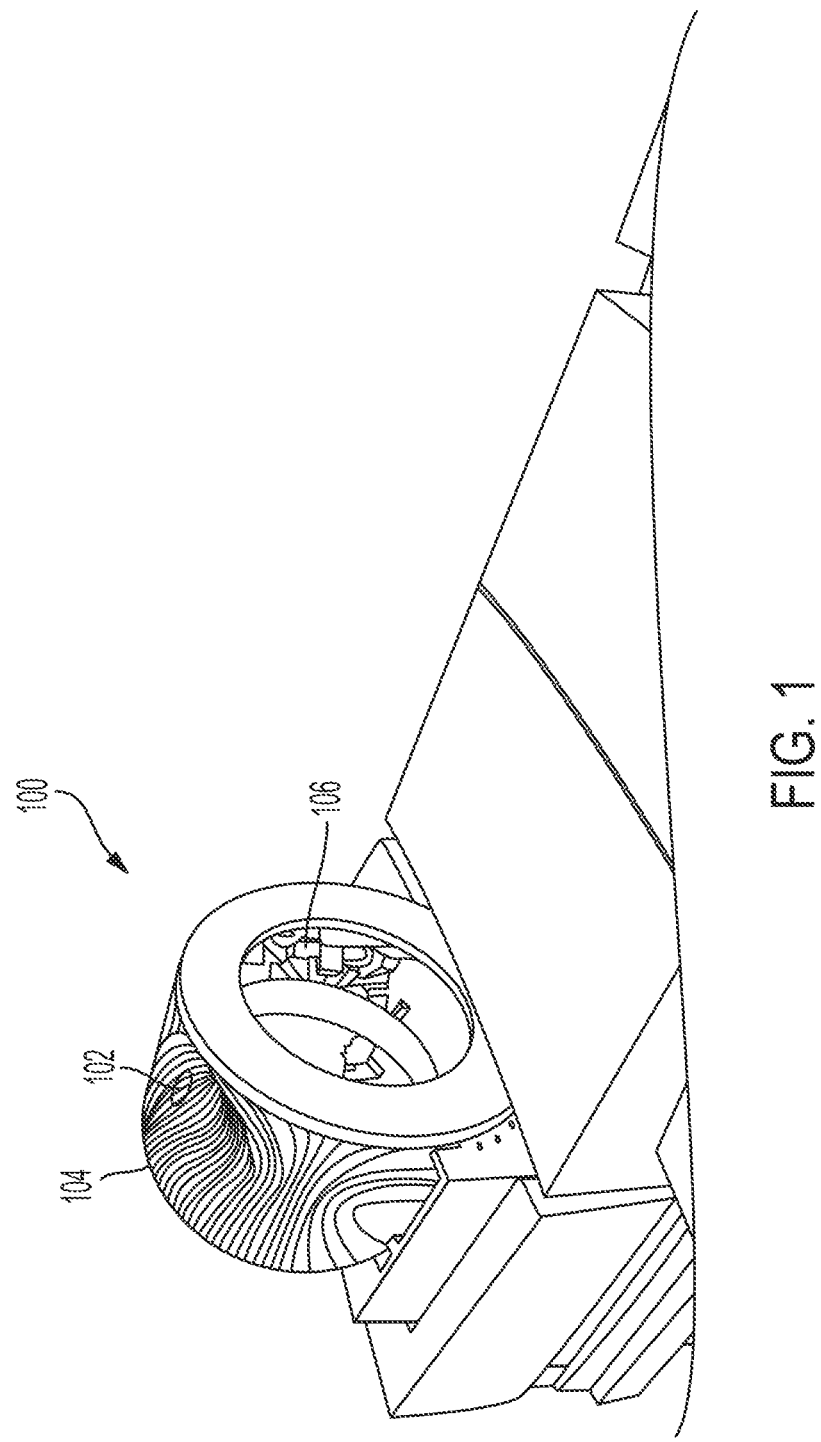
FIG. 1 depicts components of a MRI scanning system including a dome-shaped housing for a magnetic array, the dome-shaped housing surrounding a region of interest therein and further depicting the dome-shaped housing positioned to receive at least a portion of the head of a patient reclined on the table into the region of interest, in accordance with at least one aspect of the present disclosure.

FIG. 1 depicts a MRI scanning system 100 that includes a dome-shaped housing 102 configured to receive a patient's head. The dome-shaped housing 102 can further include at least one access aperture configured to allow access to the patient's head to enable a neural intervention. A space within the dome-shaped housing 102 forms the region of interest for the MRI scanning system 100. Target tissue in the region of interest is subjected to magnetization fields/pulses, as further described herein, to obtain imaging data representative of the target tissue.

Figure 1A:
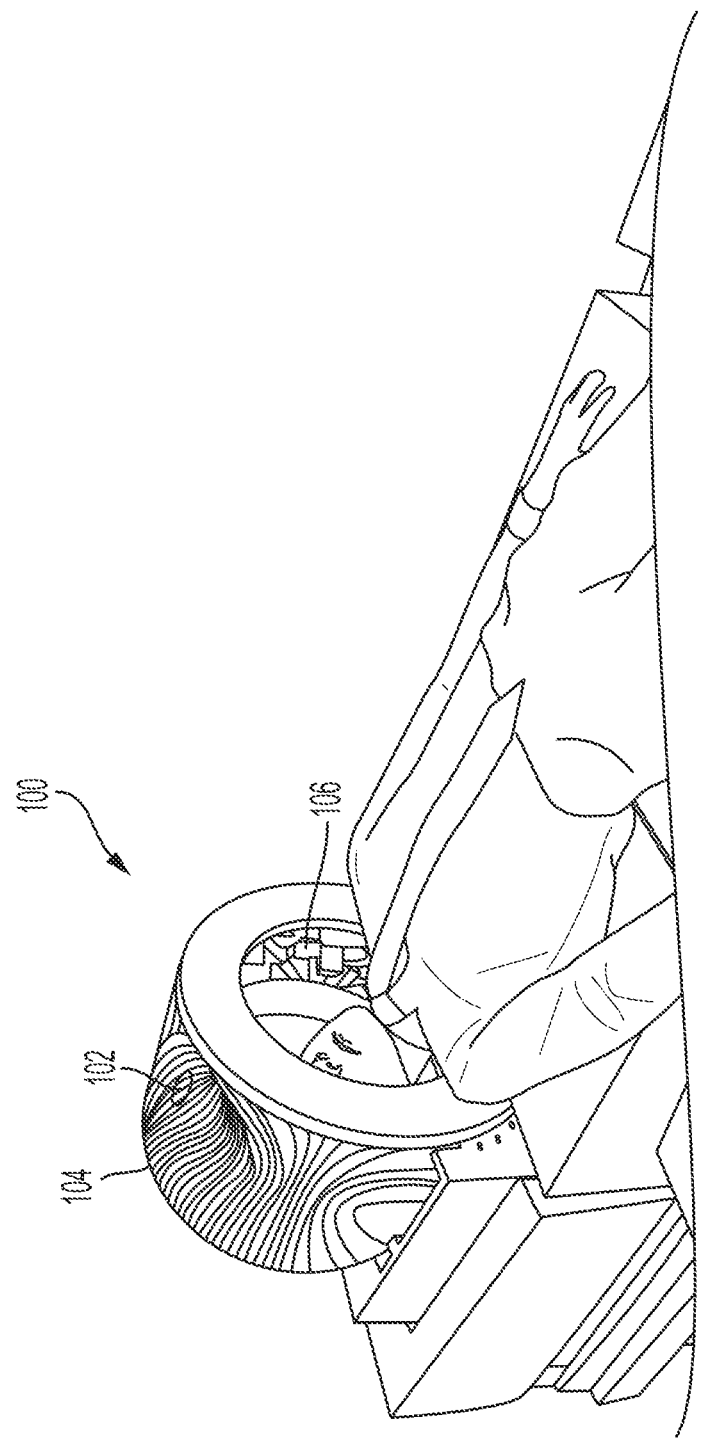
FIG. 1A depicts a patient's head positioned in the region of interest of the MRI scanning system of FIG. 1.

For example, referring to FIG. 1A, a patient can be positioned such that his/her head is positioned within the region of interest within the dome-shaped housing 102. The brain can be positioned entirely within the dome-shaped housing 102. In such instances, to facilitate intracranial interventions (e.g. neurosurgery) in concert with MR imaging, the dome-shaped housing 102 can include one or more apertures that provide access to the brain. Apertures can be spaced apart around the perimeter of the dome-shaped housing.

The MRI scanning system 100 can include an auxiliary cart (see, e.g. auxiliary cart 540 in FIG. 6) that houses certain conventional MRI electrical and electronic components, such as a computer, programmable logic controller, power distribution unit, and amplifiers, for example. The MRI scanning system 100 can also include a magnet cart that holds the dome-shaped housing 102, gradient coil(s), and/or a transmission coil, as further described herein. Additionally, the magnet cart can be attached to a receive coil in various instances. Referring primarily to FIG. 1, the dome-shaped housing 102 can further include RF transmission coils, gradient coils 104 (depicted on the exterior thereof), and shim magnets 106 (depicted on the interior thereof). Alternative configurations for the gradient coil(s) 104 and/or shim magnets 106 are also contemplated. In various instances, the shim magnets 106 can be adjustably positioned in a shim tray within the dome-shaped housing 102, which can allow a technician to granularly configure the magnetic flux density of the dome-shaped housing 102.

Various structural housings for receiving the patient's head and enabling neural interventions can be utilized with a MRI scanning system, such as the MRI scanning system 100. In one aspect, the MRI scanning system 100 may be outfitted with an alternative housing, such as a dome-shaped housing 202 (FIG. 2) or a two-part housing 302 (FIG. 3) configured to form a dome-shape. The dome-shaped housing 202 defines a plurality of access apertures 203; the two-part housing 302 also defines a plurality of access apertures 303 and further includes an adjustable gap 305 between the two parts of the housing.

Figure 3:
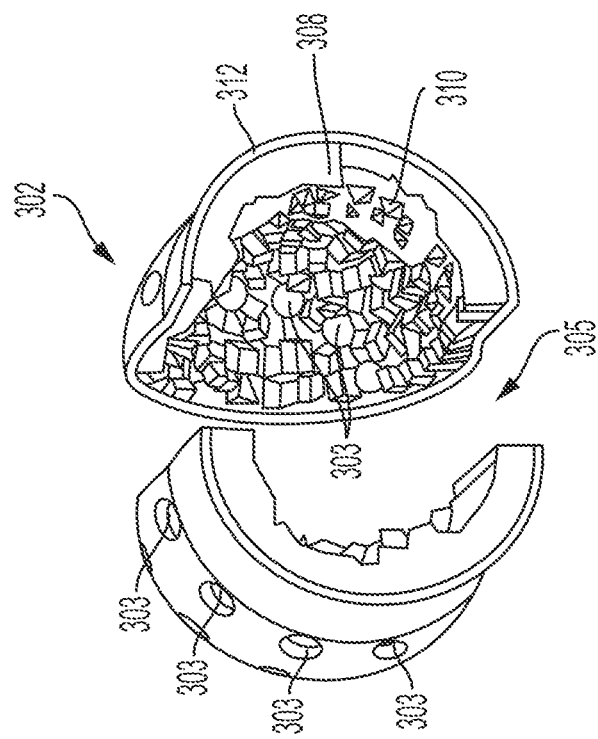
FIG. 3 is a perspective view of an alternative dome-shaped housing for a magnetic array for use with the MRI scanning system of FIG. 1, wherein access apertures and an adjustable gap is defined in the dome-shaped housing, in accordance with at least one aspect of the present disclosure.

In various instances, the housings 202 and 302 can include a bonding agent 308, such as an epoxy resin, for example, that holds a plurality of magnetic elements 310 in fixed positions. The plurality of magnetic elements 310 can be bonded to a structural housing 312, such as a plastic substrate, for example. In various aspects, the bonding agent 308 and structural housing 312 may be non-conductive or diamagnetic materials. Referring primarily to FIG. 3, the two-part housing 302 comprises two structural housings 312. In various aspect, a structural housing for receiving the patient's head can be formed from more than two sub-parts. The access apertures 303 in the structural housing 312 provide a passage directly to the patient's head and are not obstructed by the structural housing 312, bonding agent 308, or magnetic elements 310. The access apertures 303 can be positioned in an open space of the housing 302, for example.

There are many possible configurations of neural interventional MRI devices that can achieve improved access for surgical intervention. Many configurations build upon two main designs, commonly known as the Halbach cylinder and the Halbach dome described in the following article: Cooley et al. (e.g. Cooley, C. Z., Haskell, M. W., Cauley, S. F., Sappo, C., Lapierre, C. D., Ha, C. G., Stockmann, J. P., & Wald, L. L. (2018). Design of sparse Halbach magnet arrays for portable MRI using a genetic algorithm. *IEEE transactions on magnetics*, 54(1), 5100112. The article "Design of sparse Halbach magnet arrays for portable MRI using a genetic algorithm" by Cooley et al., published in *IEEE transactions on magnetics*, 54(1), 5100112 in 2018, is incorporated by reference herein in its entirety.

In various instances, a dome-shaped housing for an MRI scanning system, such as the system 100, for example, can include a Halbach dome defining a dome shape and configured based on several factors including main magnetic field $B_0$ strength, field size, field homogeneity, device size, device weight, and access to the patient for neural intervention. In various aspects, the Halbach dome comprises an exterior radius and interior radius at the base of the dome. The Halbach dome may comprise an elongated cylindrical portion that extends from the base of the dome. In one aspect, the elongated cylindrical portion comprises the same exterior radius and interior radius as the base of the dome and continues from the base of the dome at a predetermined length, at a constant radius. In another aspect, the elongated cylindrical portion comprises a different exterior radius and interior radius than the base of the dome (see e.g. FIGS. 2 and 3). In such instances, the different exterior radius and interior radius of the elongated cylindrical portion can merge with the base radii in a transitional region.

Figure 2:
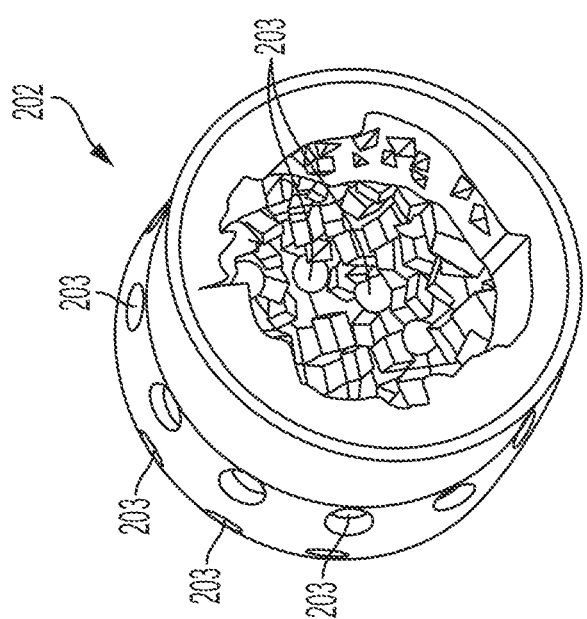
FIG. 2 is a perspective view of an alternative dome-shaped housing for a magnetic array for use with the MRI scanning system of FIG. 1, wherein access apertures are defined in the dome-shaped housing, in accordance with at least one aspect of the present disclosure.
Figure 4:
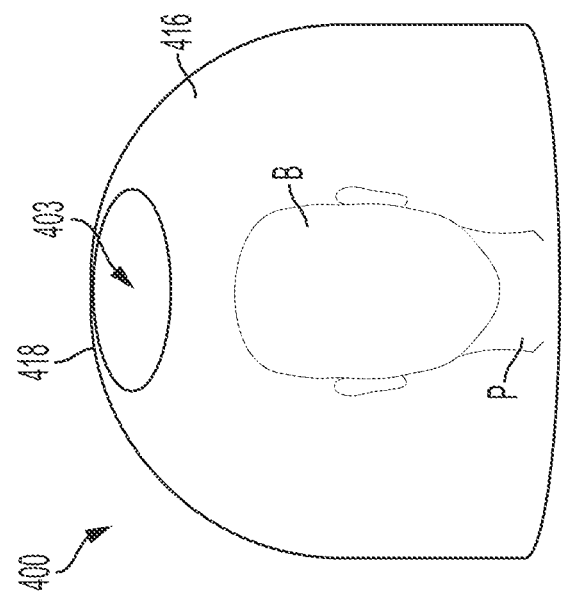
FIG. 4 depicts a dome-shaped housing for use with a MRI scanning system having an access aperture in the form of a centrally-defined hole, in accordance with at least one aspect of the present disclosure.

FIG. 4 illustrates an exemplary Halbach dome 400 for an MRI scanning system, such as the system 100, for example, which defines an access aperture in the form of a hole or access aperture 403, where the dome 400 is configured to receive a head and brain B of the patient P within the region of interest therein, and the access aperture 403 is configured to allow access to the patient P to enable neural intervention with a medical instrument and/or robotically-controlled surgical tool, in accordance with at least one aspect of the present disclosure. The Halbach dome 400 can be built with a single access aperture 403 at the top side 418 of the dome 400, which allows for access to the top of the skull while minimizing the impact to the magnetic field. Additionally or alternatively, the dome 300 can be configured with multiple access apertures around the structure 416 of the dome 400, as shown in FIGS. 2 and 3.

The diameter $D_{hole}$ of the access aperture 403 may be small (e.g. about 2.54 cm) or very large (substantially the exterior $r_{ext}$ diameter of the dome 400). As the access aperture 403 becomes larger, the dome 400 begins to resemble a Halbach cylinder, for example. The access aperture 403 is not limited to being at the apex of the dome 400. The access aperture 403 can be placed anywhere on the surface or structure 416 of the dome 400. In various instances, the entire dome 400 can be rotated so that the access aperture 403 can be co-located with a desired physical location on the patient P.

Figure 5:
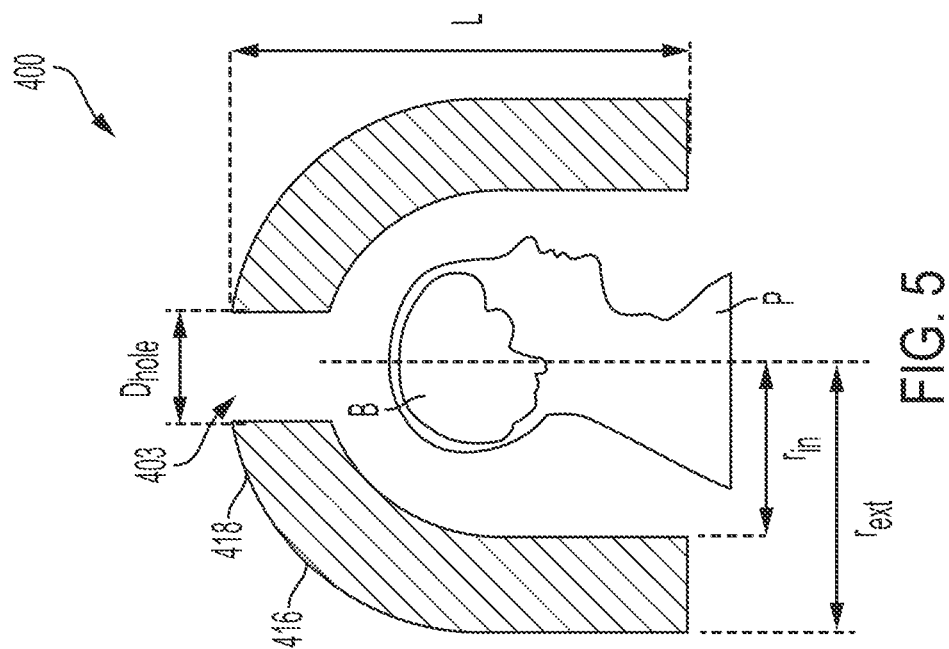
FIG. 5 is a cross-sectional view of the dome-shaped housing of FIG. 4, in accordance with at least one aspect of the present disclosure.

FIG. 5 depicts relative dimensions of the Halbach dome 400, including a diameter $D_{hole}$ of the access aperture 403, a length L of the dome 400, and an exterior radius $r_{ext}$ and an interior radius $r_{in}$ of the dome 400. The Halbach dome 400 comprises a plurality of magnetic elements that are configured in a Halbach array and make up a magnetic assembly. The plurality of magnetic elements may be enclosed by the exterior radius $r_{ext}$ and interior radius $r_{in}$ in the structure 416 or housing thereof. In one aspect, example dimensions may be defined as: $r_{in}$=19.3 cm; $r_{ext}$=23.6 cm; L=38.7 cm; and 2.54 cm≤D<19.3 cm.

Based on the above example dimensions, a Halbach dome 400 with an access aperture 403 may be configured with a magnetic flux density $B_0$ of around 72 mT, and an overall mass of around 35 kg. It will be appreciated that the dimensions may be selected based on particular applications to achieve a desired magnetic flux density $B_0$, total weight of the Halbach dome 400 and/or magnet cart, and geometry of the neural intervention access aperture 403.

In various aspects, the Halbach dome 400 may be configured to define multiple access apertures 403 placed around the structure 416 of the dome 400. These multiple access apertures 403 may be configured to allow for access to the patient's head and brain B using tools (e.g., surgical tools) and/or a surgical robot.

In various aspects, the access aperture 403 may be adjustable. The adjustable configuration may provide the ability for the access aperture 403 to be adjusted using either a motor, mechanical assist, or a hand powered system with a mechanical iris configuration, for example, to adjust the diameter $D_{hole}$ of the access aperture 403. This would allow for configuration of the dome without an access aperture 403, conducting an imaging scan, and then adjusting the configuration of the dome 400 and mechanical iris thereof to include the access aperture 403 and, thus, to enable a surgical intervention therethrough.

Halbach domes and magnetic arrays thereof for facilitating neural interventions are further described in International Patent Application No. PCT/US2022/72143, titled NEURAL INTERVENTIONAL MAGNETIC RESONANCE IMAGING APPARATUS, filed May 5, 2022, which is incorporated by reference herein in its entirety.

Figure 6:
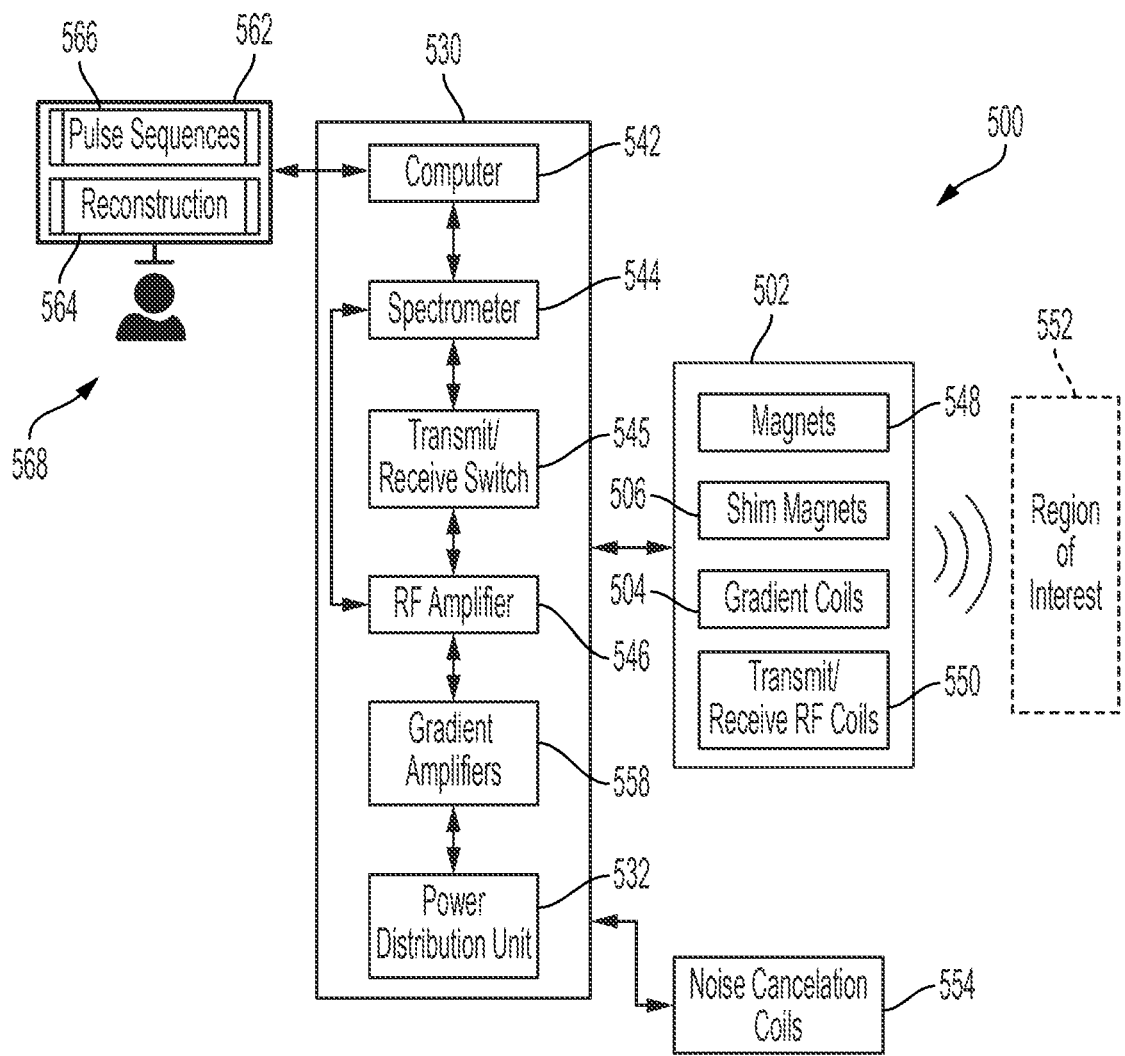
FIG. 6 depicts a control schematic for a MRI system, in accordance with at least one aspect of the present disclosure.

Referring now to FIG. 6, a schematic for an MRI system 500 is shown. The MRI scanning system 100 (FIG. 1) and the various dome-shaped housings and magnetic arrays therefor, which are further described herein, for example, can be incorporated into the MRI system 500, for example. The MRI system 500 includes a housing 502, which can be similar in many aspects to the dome-shaped housings 102 (FIG. 1), 202 (FIG. 2), and/or 302 (FIG. 3), for example. The housing 502 is dome-shaped and configured to form a region of interest, or field of view, 552 therein. For example, the housing 502 can be configured to receive a patient's head in various aspects of the present disclosure.

The housing 502 includes a magnet assembly 548 having a plurality of magnets arranged therein (e.g. a Halbach array of magnets). In various aspect, the main magnetic field $B_0$, generated by the magnetic assembly 548, extends into the field of view 552, which contains an object (e.g. the head of a patient) that is being imaged by the MRI system 500.

The MRI system 500 also includes RF transmit/receive coils 550. The RF transmit/receive coils 550 are combined into integrated transmission-reception (Tx/Rx) coils. In other instances, the RF transmission coil can be separate from the RF reception coil. For example, the RF transmission coil(s) can be incorporated into the housing 502 and the RF reception coil(s) can be positioned within the housing 502 to obtain imaging data.

The housing 502 also includes one or more gradient coils 504, which are configured to generate gradient fields to facilitate imaging of the object in the field of view 552 generated by the magnet assembly 548, e.g., enclosed by the dome-shaped housing and dome-shaped array of magnetic elements therein. Shim trays adapted to receive shim magnets 506 can also be incorporated into the housing 502.

During the imaging process, the main magnetic field $B_0$ extends into the field of view 552. The direction of the effective magnetic field ($B_1$) changes in response to the RF pulses and associated electromagnetic fields transmitted by the RF transmit/receive coils 550. For example, the RF transmit/receive coils 550 may be configured to selectively transmit RF signals or pulses to an object in the field of view 552, e.g. tissue of a patient's brain. These RF pulses may alter the effective magnetic field experienced by the spins in the sample tissue.

The housing 502 is in signal communication with an auxiliary cart 530, which is configured to provide power to the housing 502 and send/receive control signals to/from the housing 502. The auxiliary cart 530 includes a power distribution unit 532, a computer 542, a spectrometer 544, a transmit/receive switch 545, an RF amplifier 546, and gradient amplifiers 558. In various instances, the housing 502 can be in signal communication with multiple auxiliary carts and each cart can support one or more of the power distribution unit 532, the computer 542, the spectrometer 544, the transmit/receive switch 545, the RF amplifier 546, and/or the gradient amplifiers 558.

The computer 542 is in signal communication with a spectrometer 544 and is configured to send and receive signals between the computer 542 and the spectrometer 544. When the object in the field of view 552 is excited with RF pulses from the RF transmit/receive coils 550, the precession of the object results in an induced electric current, or MR current, which is detected by the RF transmit/receive coils 550 and sent to the RF preamplifier 556. The RF preamplifier 556 is configured to boost or amplify the excitation data signals and send them to the spectrometer 544. The spectrometer 544 is configured to send the excitation data to the computer 542 for storage, analysis, and image construction. The computer 542 is configured to combine multiple stored excitation data signals to create an image, for example. In various instances, the computer 542 is in signal communication with at least one database 562 that stores reconstruction algorithms 564 and/or pulse sequences 566. The computer 542 is configured to utilize the reconstruction algorithms to generate an MR image 568.

From the spectrometer 544, signals can also be relayed to the RF transmit/receive coils 550 in the housing 502 via an RF power amplifier 546 and the transmit/receive switch 545 positioned between the spectrometer 544 and the RF power amplifier 546. From the spectrometer 544, signals can also be relayed to the gradient coils 560 in the housing 502 via a gradient power amplifier 558. For example, the RF power amplifier 546 is configured to amplify the signal and send it to RF transmission coils 560, and the gradient power amplifier 558 is configured to amplify the gradient coil signal and send it to the gradient coils 560.

In various instances, the MRI system 500 can include noise cancellation coils 554. For example, the auxiliary cart 530 and/or computer 542 can be in signal communication with noise cancellation coils 554. In other instances, the noise cancellation coils 554 can be optional. For example, certain MRI systems disclosed herein may not include supplemental/auxiliary RF coils for detecting and canceling electromagnetic interference, i.e. noise.

Figure 7:
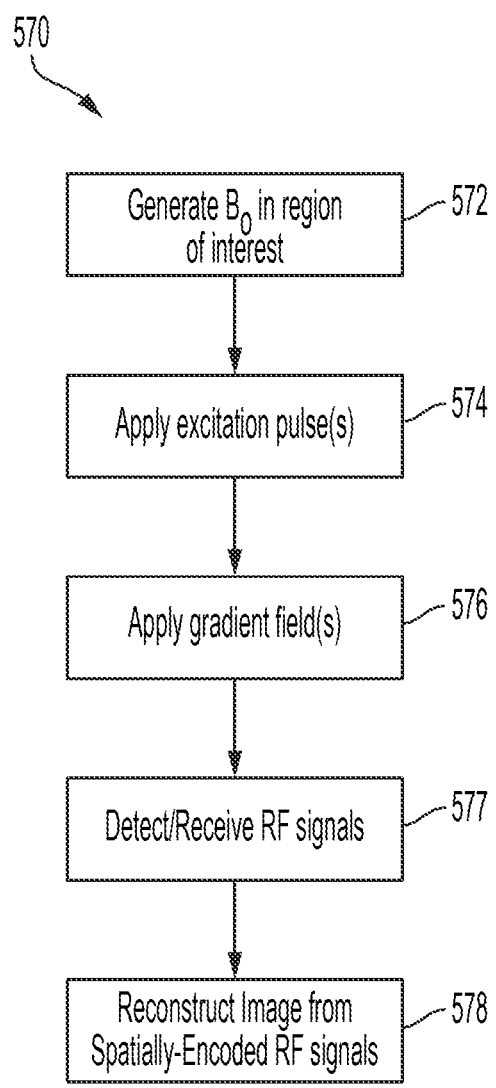
FIG. 7 is a flowchart describing a method for obtaining imaging data from an MRI system, in accordance with at least one aspect of the present disclosure.

A flowchart depicting a process 570 for obtaining an MRI image is shown in FIG. 7. The flowchart can be implemented by the MRI system 500, for example. In various instances, at block 572, the target subject (e.g. a portion of a patient's anatomy), is positioned in a main magnetic field $B_0$ in an interest of region (e.g. region of interest 552), such as within the dome-shaped housing of the various MRI scanners further described herein (e.g. magnet assembly 548). The main magnetic field $B_0$ is configured to magnetically polarize the hydrogen protons (1H-protons) of the target subject (e.g. all organs and tissues) and is known as the net longitudinal magnetization $M_0$. It is proportional to the proton density (PD) of the tissue and develops exponentially in time with a time constant known as the longitudinal relaxation time T1 of the tissue. T1 values of individual tissues depend on a number of factors including their microscopic structure, on the water and/or lipid content, and the strength of the polarizing magnetic field, for example. For these reasons, the T1 value of a given tissue sample is dependent on age and state of health.

At block 574, a time varying oscillatory magnetic field $B_1$, i.e. an excitation pulse, is applied to the magnetically polarized target subject with a RF coil (e.g. RF transmit/receive coil 550). The carrier frequency of the pulsed $B_1$ field is set to the resonance frequency of the 1H-proton, which causes the longitudinal magnetization to flip away from its equilibrium longitudinal direction resulting in a rotated magnetization vector, which in general can have transverse as well as longitudinal magnetization components, depending on the flip angle used. Common $B_1$ pulses include an inversion pulse, or a 180-degree pulse, and a 90-degree pulse. A 180-degree pulse reverses the direction of the 1H-proton's magnetization in the longitudinal axis. A 90-degree pulse rotates the 1H-proton's magnetization by 90 degrees so that the magnetization is in the transverse plane. The MR signals are proportional to the transverse components of the magnetization and are time varying electrical currents that are detected with suitable RF coils. These MR signals decay exponentially in time with a time constant known as the transverse relaxation time T2, which is also dependent on the microscopic tissue structure, water/lipid content, and the strength of the magnetic field used, for example.

At block 576, the MR signals are spatially encoded by exposing the target subject to additional magnetic fields generated by gradient coils (e.g. gradient coils 560), which are known as the gradient fields. The gradient fields, which vary linearly in space, are applied for short periods of time in pulsed form and with spatial variations in each direction. The net result is the generation of a plurality of spatially encoded MR signals, which are detected at block 577, and which can be reconstructed to form MR images depicting slices of the examination subject. A RF reception coil (e.g. RF transmit/receive coil 550) can be configured to detect the spatially-encoded RF signals. Slices may be oriented in the transverse, sagittal, coronal, or any oblique plane.

At block 578, the spatially encoded signals of each slice of the scanned region are digitized and spatially decoded mathematically with a computer reconstruction program (e.g. by computer 542) in order to generate images depicting the internal anatomy of the examination subject. In various instances, the reconstruction program can utilize an (inverse) Fourier transform to back-transforms the spatially-encoded data (k-space data) into geometrically decoded data.

Figure 8:
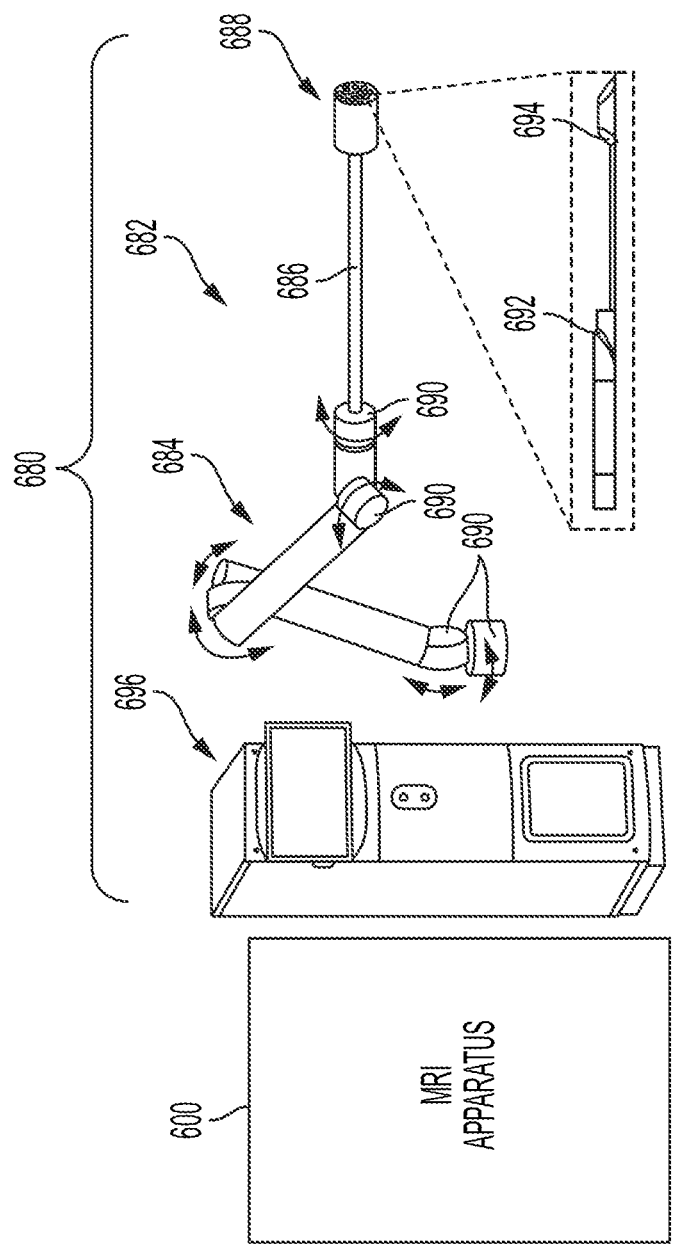
FIG. 8 depicts a MRI scanning system and a robotic system, in accordance with at least one aspect of the present disclosure.

FIG. 8 depicts a graphical illustration of a robotic system 680 that may be used for neural intervention with an MRI scanning system 600. The robotic system 680 includes a computer system 696 and a surgical robot 682. The MRI scanning system 600 can be similar to the MRI system 500 and can include the dome-shaped housing and magnetic arrays having access apertures, as further described herein. For example, the MRI system 500 can include one or more access apertures defined in a Halbach array of magnets in the permanent magnet assembly to provide access to one or more anatomical parts of a patient being imaged during a medical procedure. In various instances, a robotic arm and/or tool of the surgical robot 682 is configured to extend through an access aperture in the permanent magnet assembly to reach a patient or target site. Each access aperture can provide access to the patient and/or surgical site. For example, in instances of multiple access apertures, the multiple access apertures can allow access from different directions and/or proximal locations.

In accordance with various embodiments, the robotic system 680 is configured to be placed outside the MRI system 600. As shown in FIG. 8, the robotic system 680 can include a robotic arm 684 that is configured for movements with one or more degrees of freedom. In accordance with various embodiments, the robotic arm 684 includes one or more mechanical arm portions, including a hollow shaft 686 and an end effector 688. The hollow shaft 686 and end effector 688 are configured to be moved, rotated, and/or swiveled through various ranges of motion via one or more motion controllers 690. The double-headed curved arrows in FIG. 8 signify exemplary rotational motions produced by the motion controllers 690 at the various joints in the robotic arm 684.

In accordance with various embodiments, the robotic arm 684 of the robotic system 682 is configured for accessing various anatomical parts of interest through or around the MRI scanning system 600. In accordance with various embodiments, the access aperture is designed to account for the size of the robotic arm 684. For example, the access aperture defines a circumference that is configured to accommodate the robotic arm 684, the hollow shaft 686, and the end effector 688 therethrough. In various instances, the robotic arm 684 is configured for accessing various anatomical parts of the patient from around a side of the magnetic imaging apparatus 600. The hollow shaft 686 and/or end effector 688 can be adapted to receive a robotic tool 692, such as a biopsy needle having a cutting edge 694 for collecting a biopsy sample from a patient, for example.

The reader will appreciate that the robotic system 682 can be used in combination with various dome-shaped and/or cylindrical magnetic housings further described herein. Moreover, the robotic system 682 and robotic tool 692 in FIG. 8 are exemplary. Alternative robotic systems can be utilized in connection with the various MRI systems disclosed herein. Moreover, handheld surgical instruments and/or additional imaging devices (e.g. an endoscope) and/or systems can also be utilized in connection with the various MRI systems disclosed herein.

In various aspects of the present disclosure, the MRI systems described herein can comprise low field MRI (LF-MRI) systems. In such instances, the main magnetic field $B_0$ generated by the permanent magnet assembly can be between 0.1 T and 1.0 T, for example. In other instances, the MRI systems described herein can comprise ultra-low field MRI (ULF-MRI) systems. In such instances, the main magnetic field $B_0$ generated by the permanent magnet assembly can be between 0.03 T and 0.1 T, for example.

Higher magnetic fields, such as magnetic fields above 1.0 T, for example, can preclude the use of certain electrical and mechanical components in the vicinity of the MRI scanner. For example, the existence of surgical instruments and/or surgical robot components comprising metal, specially ferrous metals, can be dangerous in the vicinity of higher magnetic fields because such tools can be drawn toward the source of magnetization. Moreover, higher magnetic fields often require specifically-designed rooms with additional precautions and shielding to limit magnetic interference. Despite the limitations on high field MRI systems, low field and ultra-low field MRI systems present various challenges to the acquisition of high quality images with sufficient resolution for achieving the desired imaging objectives.

The LF-MRI systems and/or ULF-MRI systems described herein may be suited for use in settings considered unconventional for higher-field MRI systems, such as intensive care units, emergency rooms, and/or rural healthcare sites. For example, LF- and ULF-MRI systems may be more portable, lighter weight, smaller, and/or less expensive compared to higher-field MRI systems. However, the lower magnetic field $B_0$ strength of LF- and ULF-MRI systems can pose challenges related to acquisition times and image processing. For example, LF- and ULF-MRI systems may generally define an overall magnetic field $B_0$ homogeneity that is relatively poor (e.g., 1,000 ppm and 10,000 ppm in the region of interest) compared to higher-field MRI systems, which can lead to decreased signal-to-noise ratios (SNR). Moreover, LF- and ULF-MRI systems may lack shielding that is otherwise included in higher-field MRI systems, which can lead to increased radiofrequency and magnetic field background noise. These field homogeneity- and noise-related challenges can make it difficult to acquire magnetic resonance (MR) signals using pulse sequences often implemented by higher-field MRI systems to reduce acquisition times, such as fast spin echo sequences and/or fast gradient echo sequences. Accordingly, there is a need for LF- and ULF-MRI systems and methods for reducing MR signal acquisition times while also addressing the above-described field homogeneity- and noise-related challenges.

The present disclosure provides systems and methods for reducing MR signal acquisition times using parallel imaging and iterative image reconstruction. The systems provided herein can comprise LF- and/or ULF-MRI systems and the methods provided herein can be implemented using LF- and/or ULF-MRI systems. In at least one aspect of the present disclosure, a method for reducing MR signal acquisition times using parallel imaging and iterative image reconstruction can include receiving truncated and under-sampled k-space data sets acquired in parallel using multiple radio frequency (RF) coils positioned around an object of interest within a field of view. Each of the k-space data sets can correspond to a different one of the coils. Inverse Fourier transforming each of the k-space data sets can generate partial images of the field of view. Further, a parallel imaging reconstruction technique (e.g., sensitivity encoding (SENSE)) can be applied to generate an initial image of the full field of view based on the partial images. Yet further, an iterative image reconstruction technique can be applied to generate an updated image based on the initial image.

In various aspects, the iterative image reconstruction technique can include designating the initial image generated via parallel imaging reconstruction as an input image. A phase correction can be applied to the input image to generate a first intermediate image. Additionally, a k-space conjugate synthesis can be applied to the input image to generate a second intermediate image. An output image can be calculated based on the first intermediate image and the second intermediate image (e.g., by weighting and combining the first intermediate image and the second intermediate image). Further, the output image can be designated as the input image for the next iteration. The application of the phase correction to the input image, the application of the k-space conjugate synthesis to the input image, the calculation of the output image, and the designation of the output image as the input image for the next iteration can be repeated, for example, until a difference between the output image and the corresponding input image satisfies a predetermined threshold. The updated image can be based on the final output image of the iterative image reconstruction technique.

As explained in detail below, acquiring truncated and under-sampled k-space data sets in parallel using multiple RF coils can significantly decrease acquisition times, thereby improving efficiency and patient comfort. Furthermore, the iterative image reconstruction technique can improve the quality of the initial image generated via parallel image reconstruction by estimating the uncollected k-space of the truncated and under-sampled k-space data sets. For example, applying the phase correction to the input image to generate a first intermediate image can include forcing the phase of the input image to match a phase of a central zone of the k-space acquired via a calibration scan. Applying the k-space conjugate synthesis to the input image to generate the second intermediate image can include replacing reconstructed k-space data associated with the input image with acquired k-space data from the k-space data sets. Thus, by combining the first and second intermediate images and using the output image as an input image for the next iteration, and continuing to iterate until a predetermined threshold is satisfied, the iterative image reconstruction technique can accurately estimate the uncollected k-space. Accordingly, the systems and methods provided herein can generate accurate images with MR signal acquisition times that are reduced compared to traditional signal acquisition techniques.

Figure 11:
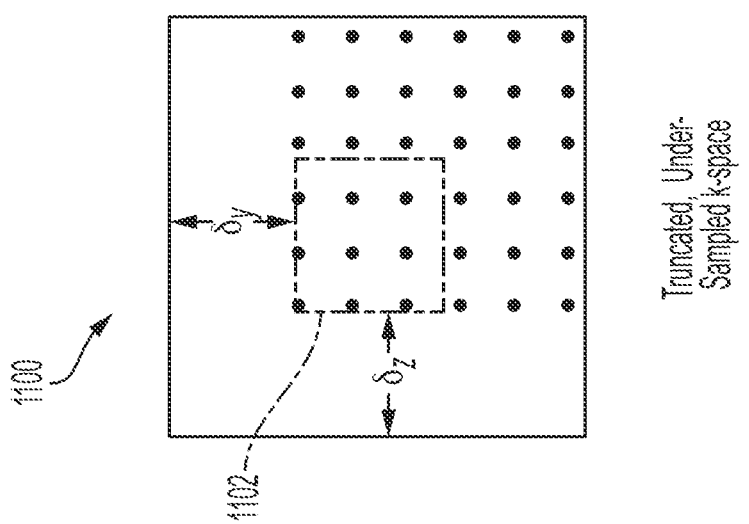
FIG. 11 depicts an example diagram of a truncated, under-sampled k-space, in accordance with various aspects of the present disclosure.
Figure 10:
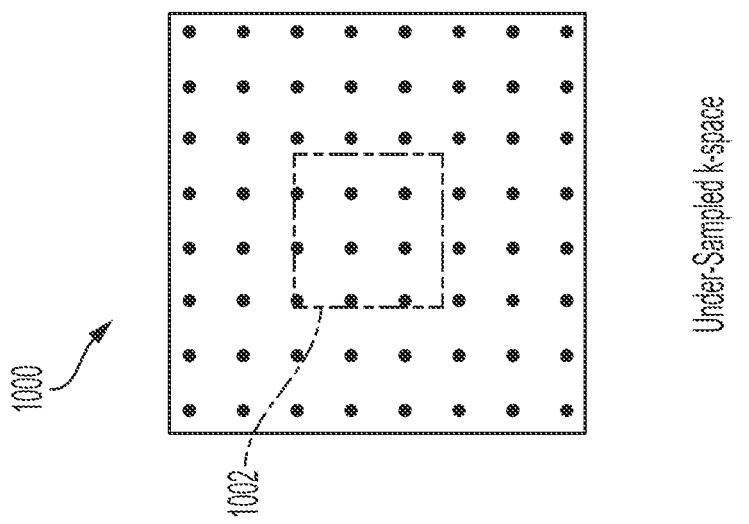
FIG. 10 depicts an example diagram of an under-sampled k-space, in accordance with various aspects of the present disclosure.
Figure 9:
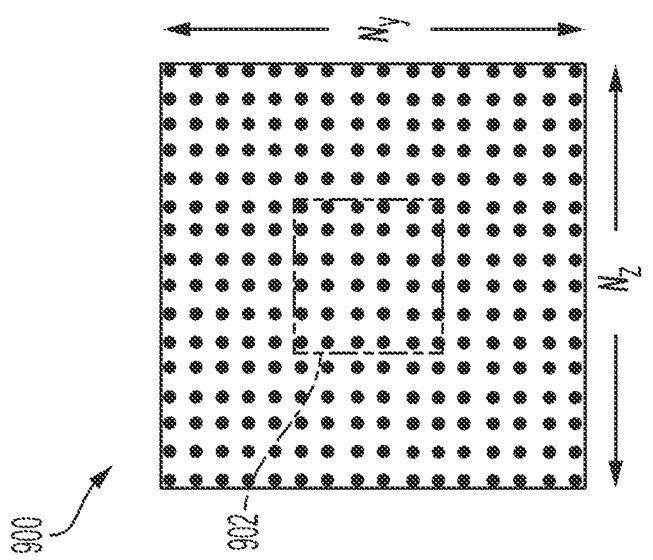
FIG. 9 depicts an example diagram of a fully-sampled k-space, in accordance with various aspects of the present disclosure.

FIG. 9 depicts an example diagram of a fully-sampled k-space 900, FIG. 10 depicts an example diagram of an under-sampled k-space 1000, and FIG. 11 depicts an example diagram of a truncated and under-sampled k-space 1100. In some aspects, FIGS. 9-11 illustrate how acquiring truncated and under-sampled k-space data sets can significantly decrease acquisition times compared to traditional MR signal acquisition techniques.

Referring to FIG. 9, the full-sampled k-space 900 represents an array of data corresponding to spatial frequencies arranged in a $k_y$ and $k_z$ direction on a Cartesian grid. The fully-sampled k-space 900 includes a total number of phase encodings $N_{phase}$ which is equal to the number of phase encodings $N_y$ in the $k_z$ direction multiplied by the number of phase encodings $N_z$ in the $k_z$ direction. For example, if the number of phase encodings $N_y$ and the number of phase encodings $N_z$ are each equal to 256, then the total number of phase encodings $N_{phase}$ is equal to 256×256. FIG. 9 also depicts a central zone 902 of the full-sampled k-space 900. Generally, the central zone 902 can correspond to lower-order phase encoding steps where echo amplitudes are larger. According to various aspects of the disclosure, as used herein, the "central zone" of the k-space can mean a zone of the k-space extending from the center of the k-space in each of the $k_y$ and $k_z$ that includes between 25% to 50% of the k-space in the $k_y$ direction and between 25% and 50% of the k-space in the $k_z$ direction. For example, a central zone of the k-space can include the middle 50%, middle 45%, middle 40%, middle 35%, middle 30%, or middle 25% of the k-space in the $k_y$ direction and the middle 50%, middle 45%, middle 40%, middle 35%, middle 30%, or middle 25% of the k-space in the $k_z$ direction.

Referring now to FIGS. 9 and 10, the under-sampled k-space 1000 does not include sampled spatial frequency data corresponding to each phase encoding $N_y$ and each phase encoding $N_z$ of the fully-sampled k-space 900. Instead, acquisition of some of the spatial frequency data of k-space 1000 is intentionally omitted or "under sampled." Thus, less time is required to acquire the spatial frequency data represented by the under-sampled k-space 1000. The degree to which the k-space 1000 is under sampled in the $k_y$ direction can be described by an under-sampling rate $R_y$, which is equal to the number phase encodings $N_y$ for a fully-sampled data set divided by the actual number of phase encodings $N_{ys}$ acquired. The degree to which the k-space 1000 is under sampled in the $k_z$ direction in the can be described by an under-sampling rate $R_z$, which is equal to the number of encodings $N_z$ for a fully-sampled data set divided by the actual number of phase encodings $N_{zs}$ acquired. For example, if the under-sampling rate $R_y$ and the under-sampling rate $R_z$ are each equal to 2, and the number of phase encodings $N_y$ and $N_z$ for a fully sampled k-space are each equal to 256, then the number of actually-sampled phase encodings $N_{ys}$ and $N_{zs}$ in the under-sampled the k-space 1000 can be represented by (256/2)×(256/2), or ¼ the number of phase encodings $N_{phase}$ sampled for the fully sampled k-space. FIG. 10 also depicts a central zone 1002 of the under-sampled k-space 1000.

Referring now to FIGS. 10 and 11, the truncated and under-sampled k-space 1100 is similar the under-sampled k-space 1000, except that the k-space 1100 is not sampled according to a truncation extent $\delta_y$ in the $k_y$ direction and not sampled according to a truncated extent $\delta_z$ in the $k_z$ direction. The truncation extents $\delta_y$ and $\delta_z$ represent the number of phase encodings that are omitted from corresponding edges of a fully sampled k-space. For example, if the number of phase encodings $N_y$ and $N_z$ for a fully sampled k-space are each equal to 256, the under-sampling rate $R_y$ and $R_z$ are each equal to 2, and the truncation extents $\delta_y$ and $\delta_z$ are each equal to 96, then the number of actually-sampled phase encodings in the truncated and under-sampled k-space 1100 can be represented by ((256−96)/2)×((256−96)/2). In the example shown in FIG. 11, the truncation extents $\delta_y$ and $\delta_z$ are selected such that slightly more that the bottom right quadrant of the k-space 1100 is sampled (under sampled), thereby including the central zone 1102 of the k-space 1100. However, in other aspects, truncation extents $\delta_y$ and $\delta_z$ can be configured such that another quadrant (e.g., top right, top left, bottom left) or another partial area of the k-space 1100 is sampled. According to some aspects of the disclosure, where one quadrant of the k-space corresponds to 25% of the k-space phase encodings for a fully sampled k-space, a truncated k-space where "slightly more" than one quadrant of the k-space is sampled can mean that between 25% to 50% of the phase encodings of a fully-sampled k-space are sampled, such as, for example, where 30%, 35%, 40%, or 45% of the phase encodings of a fully-sampled k-space are sampled.

As illustrated by FIGS. 9-11 and the accompanying description above, acquiring a truncated and under-sampled k-space 1100 data set can significantly decrease acquisition times compared to acquiring a fully-sampled k-space 900 data set. For example, the total acquisition time $T_{acq-tu}$ required to sample a truncated and under-sampled k-space 1100 data as a function of the total acquisition time $T_{acu-f}$ required to sample a fully-sampled k-space 900 data set can be represented by the following equation:

$$T_{acq-tu} = \left(\frac{T_{acq-f}}{R_y R_z}\right)\left(\frac{N_y - \delta_y}{N_y}\right)\left(\frac{N_z - \delta_z}{N_z}\right)$$

Thus, in the example above where the number of phase encodings $N_y$ and $N_z$ for a fully sampled k-space are each equal to 256, the under-sampling rate $R_y$ and $R_z$ are each equal to 2, and the truncation extents $\delta_y$ and $\delta_z$ are each equal to 96, the total acquisition time $T_{acq-tu}$ required to sample a truncated and under-sampled k-space 1100 is equal to approximately $0.10 T_{acq-f}$, or 10% of the total acquisition time $T_{acu-f}$ required to sample a fully-sampled k-space 900.

Although the truncated and under-sampled k-space 1100 can be acquired more quickly than a fully-sampled k-space 900, various challenges exist related to reconstructing an accurate image based on the truncated and under-sampled k-space 1100. For example, reconstructing an image from an under-sampled k-space, such as the under-sampled k-space 1000, can present challenges because the number of spatial frequencies represented in the under-sampled k-space may be insufficient to generate an image that adequately represents an the object of interest within the field of view. Thus, an image generated based on an under-sampled k-space data set can result in the image having aliasing and only partially representing the field of view. The challenges associated with reconstructing an image from an under-sampled k-space can be further compounded by truncating the k-space in both the $k_y$ and $k_z$ directions, as illustrated by the truncated and under-sampled k-space 1100 FIG. 11, because, for example, at least some missing portions of the k-space cannot be estimated based on conjugate symmetry.

Various parallel imaging techniques can be applied to under-sampled k-space data to address the above-mentioned issues related to aliasing and reduced field of view. For example, according to the sensitivity encoding (SENSE) technique, multiple RF coils positioned around an object of interest within a field of view are used to acquire separate, under sampled k-space data sets concurrently. The k-space data sets are each inverse Fourier transformed to create partial images of the field of view. Further, based on RF coil sensitivity maps calculated from calibration scans for each coil, which comprise information related to the position of each RF coil relative to the object of interest, the partial images are combined to generate a full field-of-view image. Various details related to an example implementation of the SENSE technique are described in the article titled "SENSE: Sensitivity Encoding for Fast MRI" by Pruessmann et al., published in *Magnetic Resonance in Medicine*," 42(5), 952-962 in 1999, which is incorporated by reference herein in its entirety. Although SENSE and other parallel imaging techniques can address various challenges related to reconstructing images from under-sampled k-space data, there remains a need for image reconstruction techniques to reconstruct images from truncated and under-sampled k-space data.

Figure 12:
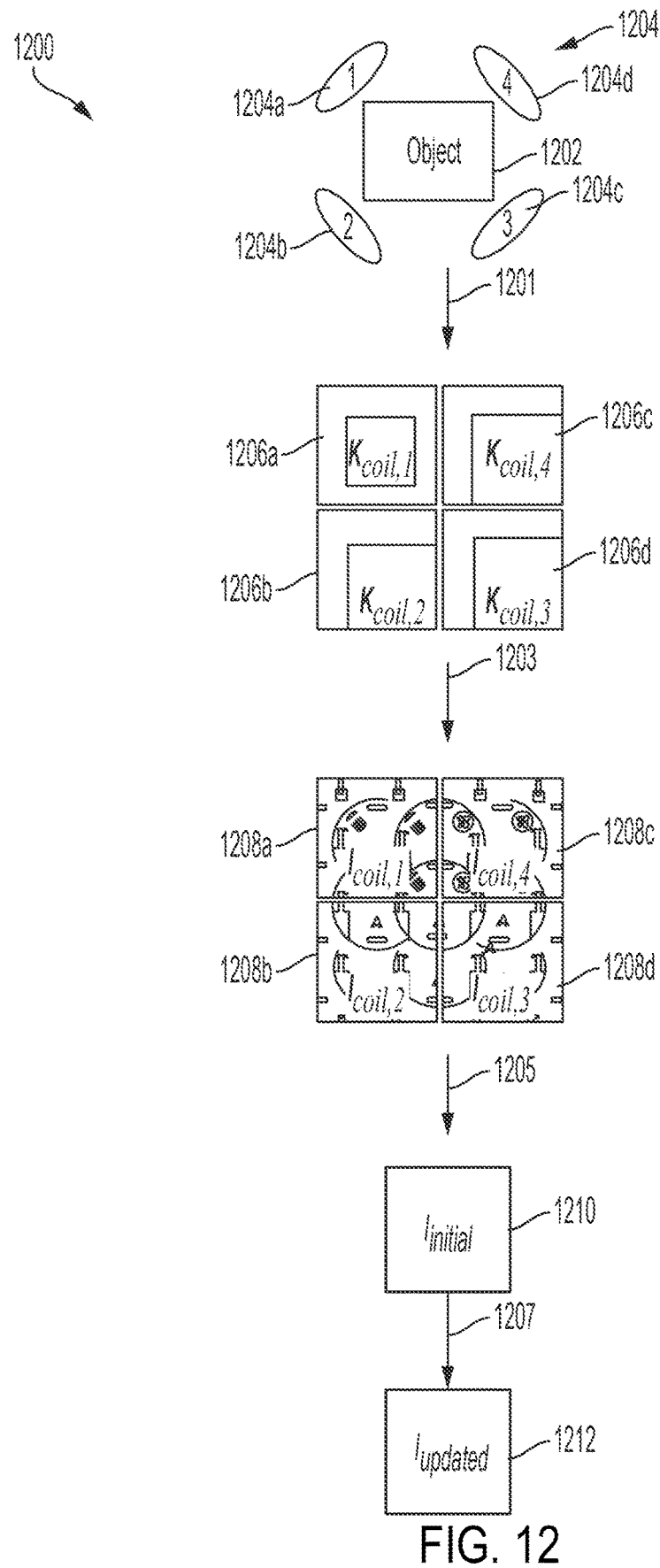
FIG. 12 is a flowchart describing a method for magnetic resonance imaging based on truncated, under-sampled k-space data sets, in accordance with at least one aspect of the present disclosure.

FIG. 12 is a flowchart describing a method 1200 for magnetic resonance imaging based on truncated, under-sampled k-space data sets, in accordance with at least one aspect of the present disclosure. The method 1200 may be carried out by an MRI system comprising an array of magnets, a radio frequency (RF) coil assembly 1204 comprising an array of RF coils 1204a-d, and a control circuit. The array of magnets can be configured to generate a magnetic field toward an object 1202 of interest within a field of view. The RF coils 1204a-d are positionable around the object 1202 of interest and are configured to acquire magnetic resonance signals. The control circuit can comprise a processor and memory. The memory can store instructions executable by the processor to carry out the method 1200. In some aspects, the method 1200 can be carried out by the various MRI systems described herein, such as the MRI system 500 of FIG. 6. For example, the RF coil assembly 1204 of FIG. 12 can be similar to the RF transmit/receive coils 550 and the executable instructions for carrying out the method 1200 can be stored as reconstruction algorithms 564 in the at least one database 562 and executed by the computer 542.

Referring to FIG. 12, according to the method 1200, k-space data sets 1206a-d acquired by the RF coils 1204a-d are received 1201 (e.g. by the computer 542 and/or the transmit/receive switch 545 of FIG. 6). The k-space data sets 1206a-d can be acquired in parallel (e.g. concurrently) and are truncated and under sampled. Each of the k-space data sets 1206a-d correspond to a different one or more than one of the RF coils 1204a-d. For example the first k-space data set 1206a can correspond to the first RF coil 1204a, the second k-space data set 1206b can correspond to the second RF coil 1204b, the third k-space data set 1206c can correspond to the third RF coil 1204c, and the fourth k-space data set 1206d can correspond to the fourth RF coil 1204d.

The k-space data sets 1206a-d can be under sampled in the $k_y$ direction at under-sampling rate $R_y$ equal to or greater than 2, such as under-sampling rate $R_y$ equal to 2, 2.5, or 3. The k-space data sets 1206a-d can be under sampled in the $k_z$ direction at under-sampling rate $R_z$ equal to or greater than 2, such as under-sampling rate $R_y$ equal to 2, 2.5, or 3. The k-space data sets 1206a-d can have a truncation extent $\delta_y$ in the $k_y$ direction in a range of 10% to 50% of the number of phase encodings in a fully sample k-space, such as a truncation extent $\delta_y$ equal to 10%, 15%, 20%, 25%, 30%, 37.5%, 40%, 45% or 50% of the number of phase encodings in a fully sample k-space. The k-space data sets 1206a-d can have a truncation extent $\delta_z$ in the $k_z$ direction in a range of 10% to 50% of the number of phase encodings in a fully sample k-space, such as a truncation extent $\delta_z$ equal to 10%, 15%, 20%, 25%, 30%, 37.5%, 40%, 45% or 50% of the number of phase encodings in a fully sample k-space. As explained above, acquiring truncated and under sampled k-space data sets 1206a-d in parallel can significantly reduce acquisition times compared to acquisition times required for a fully-sampled k-space data set. For example, configuring k-space data sets 1206a-d to be under sampled at an under-sampling rates of $R_y$ and $R_z$ equal to 2 and to have truncation extents $\delta_y$ and $\delta_z$ equal to 37.5% of the number of phase encodings in a fully sample k-space (e.g., where $\delta_y=\delta_z=96$ and $N_y=N_z=256$) can reduce the time required to acquire the k-space data sets 1206a-d by about 10% compared to a fully sampled k-space.

Referring still to FIG. 12, according to the method 1200, partial images 1208a-d are generated 1203 based on the k-space data sets 1206a-d. The partial images 1208a-d can be generated 1203 based on the k-space data sets 1206a-d by inverse Fourier transforming each of the k-space data sets 1206a-d. The partial images 1208a-d are each partial images of the field of view and may have aliasing because of k-space data sets 1206a-d are under sampled. Each of the partial images 1208a-d correspond to a different one or more than one of k-space data sets 1206a-d. For example the first partial image 1208a can correspond to the first k-space data set 1206a, the second partial image 1208b can correspond to the second k-space data set 1206b, the third partial image 1208c can correspond to the third k-space data set 1206c, and the fourth partial image 1208d can correspond to the fourth k-space data set 1206d.

Referring still to FIG. 12, according to the method 1200, an initial image 1210 is generated 1205 based on the partial images 1208a-d. The initial image can be a full image of the field of view. The initial image 1210 can be generated 1205 according to various parallel imaging techniques, such as SENSE. For example, according to some aspects of the method 1200, calibration k-space data sets acquired by the RF coils 1204a-d may be received and a coil sensitivity map may be generated based on the calibration k-space data sets. The coil sensitivity map can include information related to the position of each of the RF coils 1204a-d relative to the object 1202 in the field of view. The initial image 1210 can be generated 1205 based on the partial images 1208a-d and the coil sensitivity map. In some aspects, the initial image 1210 can be generated 1205 based on the partial images 1208a-d according to techniques described in the aforementioned article titled "SENSE: Sensitivity Encoding for Fast MRI" by Pruessmann et al., published in *Magnetic Resonance in Medicine,"* 42(5), 952-962 in 1999. In other aspects, the initial image 1210 can be generated 1205 based on the partial images 1208a-d according to parallel imaging techniques such as Array coil Spatial Sensitivity Encoding Technique (ASSET). In yet other aspects, the initial image 1210 can be generated 1205 based on the k-space data sets 1206a-d according to parallel imaging techniques such as GeneRalized Autocalibrating Partial Parallel Acquisition (GRAPPA) or Autocalibrating Reconstruction for Cartesian imaging (ARC). Various details related to GRAPPA are described in the article titled "*Generalized Autocalibrating Partially Parallel Acquisitions (GRAPPA),"* by Griswold et al., published in *Magnetic Resonance in Medicine* 47, 1202-1210 in 2002, which is incorporated by reference herein in its entirety.

In some aspects, because the initial image 1210 is derived from k-space data sets 1206a-d that are truncated, the initial image 1210 may require further reconstruction to adequately represent the object 1202. Thus, according to the method 1200, an iterative image reconstruction technique can be applied 1207 to generate an updated image 1212 based on the initial image 1210. The iterative image reconstruction technique can estimate the uncollected k-space, thereby generating an updated image 1212 that accurately represents the object 1202. In some aspects, the iterative image reconstruction technique can be applied 1207 according to the iterative image reconstruction technique 1300, as described below with respect to FIG. 13.

Although FIG. 12 depicts the RF coil assembly 1204 having a first RF coil 1204a, a second RF coil 1204b, a third RF coil 1204c, and a fourth RF coil 1204d, persons of ordinary skill in the art will understand that the RF coil assembly 1204 can be configured to include any number of RF coils 1204 that is suitable for parallel signal acquisition. For example, 2, 3, 4, 5, 6, 7, 8, 9, 10, or more than 10 coils may be included in the RF coil assembly. Similarly, although the method 1200 is described above as generating a first k-space data set 1206a, a second k-space data set 1206b, a third k-space data set 1206c, and a fourth k-space data set 1206d; and is described above as generating a first partial image 1208a, a second partial image 1208b, a third partial image 1208c, and a fourth partial image 1208d, persons of ordinary skill in the art will understand that the number of k-space data sets and the number of partial images generated according to the method 1200 can correspond to configuration of the RF coils (e.g., the number of RF coils) in the RF coil assembly 1204.

Figure 13:
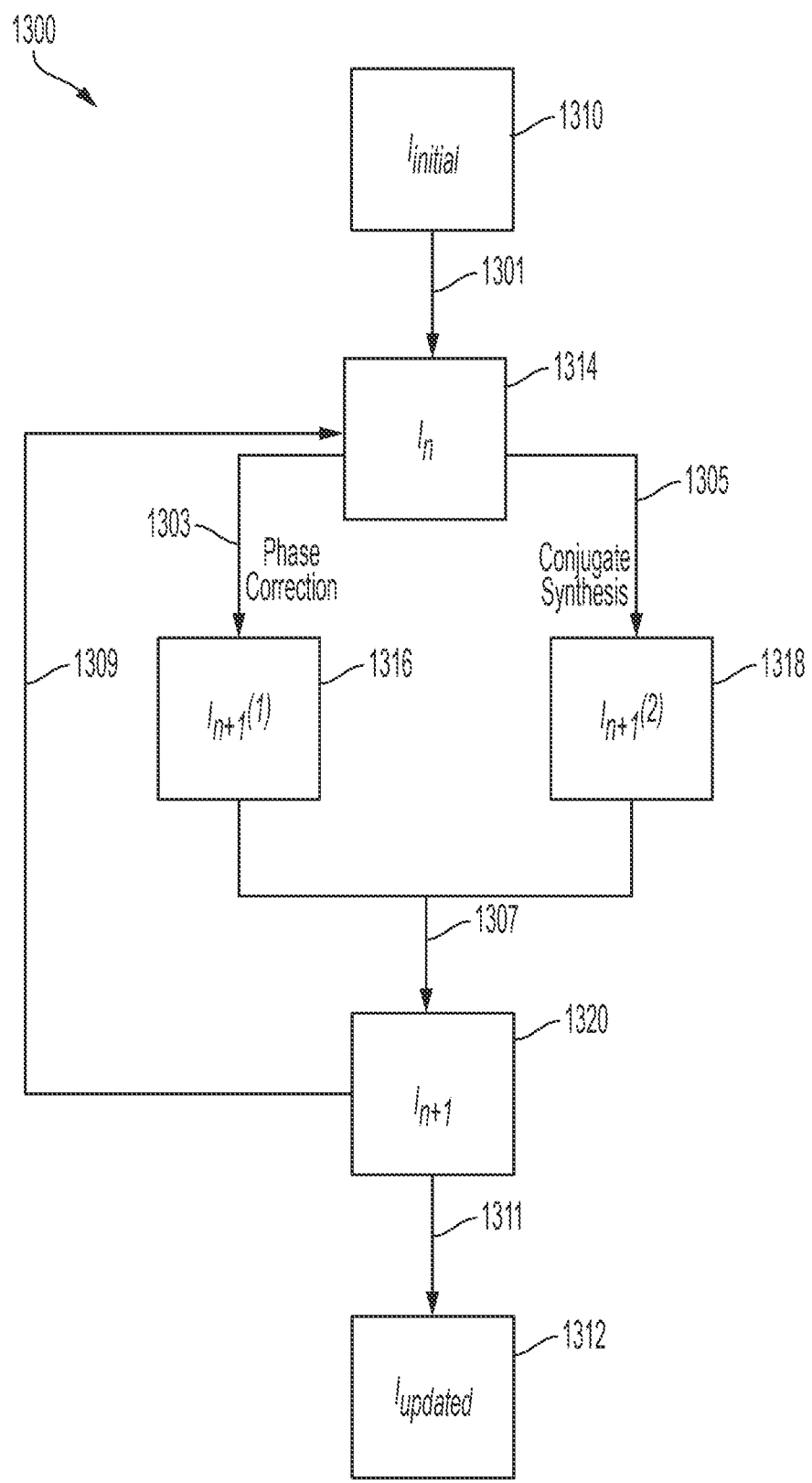
FIG. 13 is a flowchart describing an iterative image reconstruction technique that may be implemented as part of a method for magnetic resonance based on truncated, under-sampled k-space data sets, in accordance with at least one aspect of the present disclosure.

FIG. 13 is a flowchart describing an iterative image reconstruction technique 1300 (sometimes referred to as iterative technique 1300), in accordance with at least one aspect of the present disclosure. In some aspects, the iterative technique 1300 can be applied 1207 according to method 1200 (FIG. 12) to generate an updated image 1312 based on an initial image 1310. For example, the initial image 1310 (FIG. 13) can correspond to the initial image 1210 (FIG. 12) and the updated image 1312 (FIG. 13) can correspond to the updated image 1212 (FIG. 12).

Referring to FIG. 13, the initial image 1310 is designated 1301 as an input image 1314 for the iterative technique 1300. Thus, the initial image 1310 can serve as the input image 1314 ($I_n$) for the first iteration of the iterative technique (e.g., $I_{initial}=I_{n=1}$). According to the iterative technique 1300, a phase correction is applied 1303 to the input image 1314 ($I_n$) to generate a first intermediate image 1316 ($I_{n+1}^{(1)}$) and a k-space conjugate synthesis is applied 1305 to generate a second intermediate image 1318 ($I_{n+1}^{(2)}$). Applying 1303 the phase correction to the input image 1314 ($I_n$) to generate a first intermediate image 1316 ($I_{n+1}^{(1)}$) can include forcing the phase of the input image 1314 ($I_n$) to match a phase of a central zone of the k-space acquired via a calibration scan. In some aspects, the calibration scan used to determine the phase of the central zone of the k-space can be the same calibration scan used to generate coil sensitivity maps for parallel image reconstruction (e.g., for generating 1205 the initial image 1210 as described above with respect to FIG. 12). Applying 1305 the k-space conjugate synthesis to the input image 1314 ($I_n$) to generate the second intermediate image 1318 ($I_{n+1}^{(2)}$) can include replacing reconstructed k-space data associated with the input image 1314 ($I_n$) with acquired k-space data from the k-space data sets 1206a-d (e.g. the k-space data sets 1206a-d of FIG. 12). In some aspects, applying 1303 the phase correction to the input image 1314 ($I_n$) to generate a first intermediate image 1316 ($I_{n+1}^{(1)}$) and/or applying 1305 the k-space conjugate synthesis to the input image 1314 ($I_n$) to generate the second intermediate image 1318 ($I_{n+1}^{(1)}$) can be executed according to the example implementation of the iterative image reconstruction technique 1400 as described below with respect to FIG. 14.

Referring again to FIG. 13, according to the iterative technique 1300, an output image 1320 ($I_{n+1}$) is calculated 1307 based on the first intermediate image 1316 ($I_{n+1}^{(1)}$) and the second intermediate image 1318 ($I_{n+1}^{(2)}$). In some aspects, the output image 1320 ($I_{n+1}$) can be calculated 1307 by adding the product of a first weighting factor ($w_1$) and the first intermediate image 1316 ($I_{n+1}^{(1)}$) to the product of a second weighting factor ($w_2$) and the second intermediate image 1318 ($I_{n+1}^{(2)}$), wherein the sum of the first weighting factor ($w_1$) and second weighting factor ($w_2$) is equal to one. In some aspects, calculating 1307 the output image 1320 ($I_{n+1}$) can be executed according to the example implementation of the iterative image reconstruction technique 1400 as described below with respect to FIG. 14.

Referring again to FIG. 13, the output image 1320 ($I_{n+1}$) can be designated 1309 as the input image 1314 ($I_n$) for a next iteration of the iterative technique 1300. Further, for the next iteration, the phase correction can be applied 1303 to the input image 1314 ($I_n$), the k-space conjugate synthesis can be applied 1305 to the input image 1314 ($I_n$), the output image 1320 ($I_{n+1}$) can be calculated 1307, and the output image 1320 ($I_{n+1}$) can again be designated 1309 as the input image 1314 ($I_n$) for yet a next iteration.

The updated image 1312 ($I_{updated}$) can be designated based on the output image 1320 ($I_{n+1}$) of a given iteration of the iterative technique 1300. For example, iterations can be repeated until a predetermined threshold is satisfied. Upon satisfying the predetermined threshold, the updated image 1312 ($I_{updated}$) can be designated based on a final output image 1320 ($I_{n+1}$) of the iterative technique 1300. According to some aspects of the iterative technique 1300, the predetermined threshold can be satisfied based on a difference between the output image 1320 ($I_{n+1}$) and the corresponding input image 1314 ($I_n$) of a given iteration. For example, the predetermined threshold may be satisfied when a output image 1320 ($I_{n+1}$) is less than 10% different than the corresponding input image 1314 ($I_n$), such as less than 5%, less than 1%, less than 0.1%, less than 0.01%, or less than 0.001% different than the corresponding input image 1314 ($I_n$). According to some aspects of the iterative technique 1300, the predetermined threshold can be satisfied based on a number of iterations performed. For example, the predetermined threshold may be satisfied when iterative technique 1300 has achieved 10 iterations, or more than 10 iterations, such as 100 iterations, 1,000 iterations, or 10,000 iterations. By calculating 1307 the output image 1320 ($I_{n+1}$) based first intermediate image 1316 ($I_{n+1}^{(1)}$) and the second intermediate image 1318 ($I_{n+1}^{(2)}$), designating 1309 the output image 1320 ($I_{n+1}$) as an input image 1314 ($I_n$) for the next iteration, and continuing to iterate until a predetermined threshold is satisfied, the iterative image reconstruction technique 1300 can accurately estimate k-space that is not sampled due to under sampling and truncation.

Figure 14:
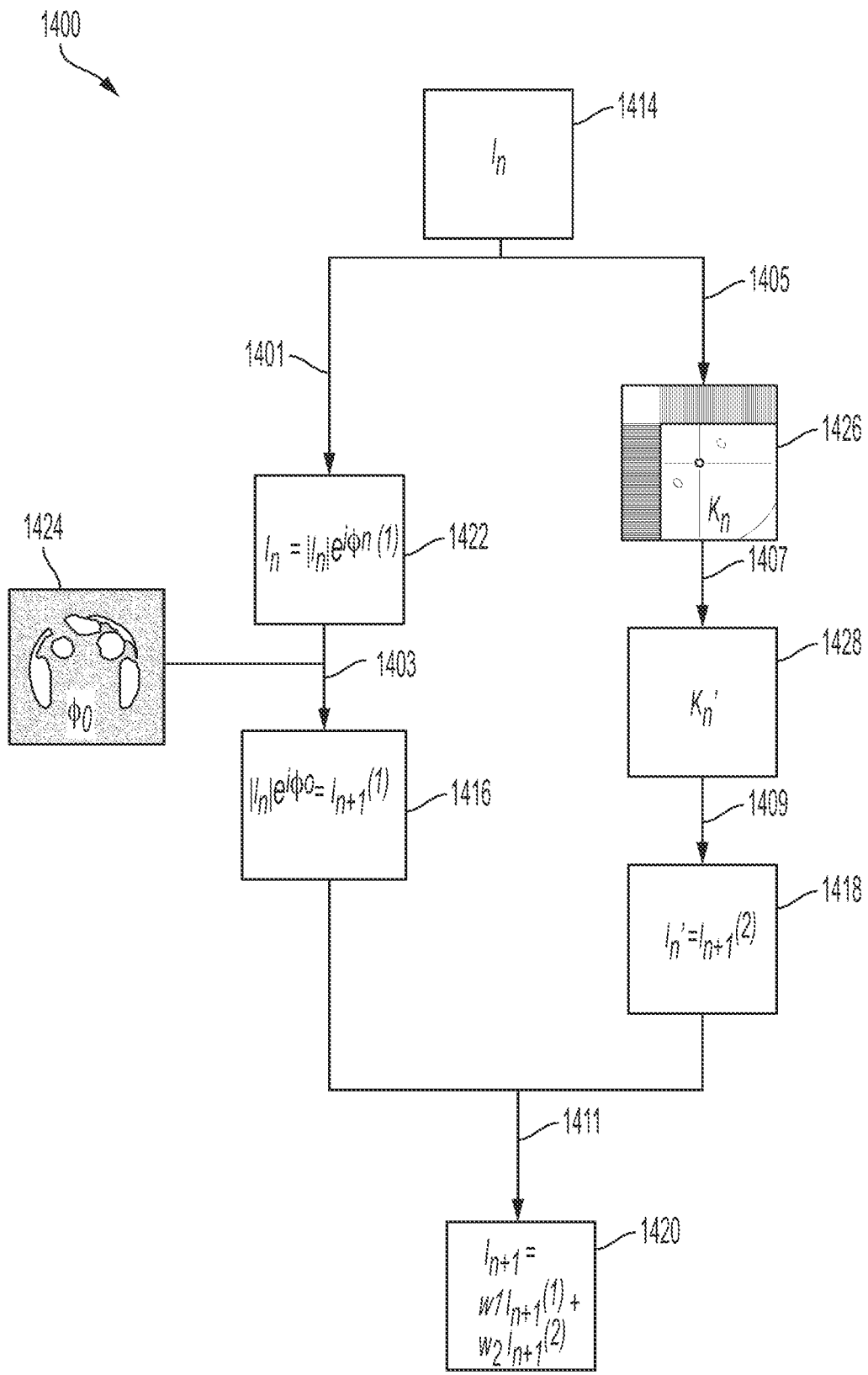
FIG. 14 is a flowchart describing an example implementation of the iterative image reconstruction technique described with respect to FIG. 13, in accordance with at least one aspect of the present disclosure.

FIG. 14 is a flowchart describing an iterative image reconstruction technique 1400 (sometimes referred to as the iterative technique 1400), in accordance with at least one aspect of the present disclosure. In some aspects, the iterative technique 1400 can represent an example implementation of the iterative image reconstruction technique 1300 described with respect to FIG. 13. For example, the input image 1414 ($I_n$) (FIG. 14) can correspond to the input image 1314 ($I_n$) (FIG. 14), the first intermediate image 1416 ($I_{n+1}^{(1)}$) (FIG. 14) can correspond to the first intermediate image 1316 ($I_{n+1}^{(1)}$) (FIG. 13), the second intermediate image 1418 ($I_{n+1}^{(2)}$) (FIG. 14) can correspond to the second intermediate image 1318 ($I_{n+1}^{(2)}$) (FIG. 13), and the output image 1420 ($I_{n+1}$) (FIG. 14) can correspond to the output image 1320 ($I_{n+1}$) (FIG. 13).

Referring to FIG. 14, according to the iterative technique 1400, a phase correction can be applied to the input image 1414 ($I_n$) to generate the first intermediate image 1416 ($I_{n+1}^{(1)}$) by determining 1401 a phase and a magnitude of the input image 1422 ($I_n=|I_n|e^{i\phi_n}$) and calculating 1403 the first intermediate image 1416 ($I_{n+1}^{(1)}$) based on the magnitude of the input image 1422 ($|I_n|$) and a phase map 1424 of the central zone of the k-space ($\phi_0$). For example, calculating 1403 the first intermediate image 1416 ($I_{n+1}^{(1)}$) based on the magnitude of the input image 1422 ($|I_n|$) and a phase map 1424 of the central zone of the k-space ($\phi_0$) can include forcing the phase of the input image 1414 ($I_n$) to match the phase ($\phi_0$) of the central zone of the k-space ($I_{n+1}^{(1)}=|I_n|e^{i\phi_0}$). According to some aspects of the iterative technique 1400, the a phase map 1424 of the central zone of the k-space ($\phi_0$) is generated based on calibration k-space data sets acquired by the RF coils of the RF coil assembly (e.g., the RF coils 1204a-d of RF coil assembly 1204 of FIG. 12). In one aspect, the calibration k-space data sets acquired by the RF coils are the same the calibration k-space data sets acquired to generate the coil sensitivity map that is used to generate 1205 the initial image 1210 according to a parallel imaging techniques, as described above with respect to FIG. 12.

Referring again to FIG. 14, according to the iterative technique 1400, a k-space conjugate synthesis can be applied to the input image 1414 ($I_n$) to generate the second intermediate image 1418 ($I_{n+1}^{(2)}$) by generating 1405 a first intermediate k-space 1426 ($K_n$), generating 1407 a second intermediate k-space 1428 ($K_n'$) based on the first intermediate k-space 1426 ($K_n$), and generating the second intermediate image 1418 ($I_{n+1}^{(2)}$) based on the second intermediate k-space 1428 ($K_n'$). For example, the first intermediate k-space 1426 ($K_n$) can be generated 1405 by Fourier transforming the input image 1414 ($I_n$). Then, the second intermediate k-space 1428 ($K_n'$) can be generated 1407 by replacing at least some of the k-space values of the first intermediate k-space 1426 ($K_n$) with actually-acquired k-space values from one or more than one of the k-space data sets 1206a-d received 1201 according to the method 1200 if FIG. 12. For example, all of the actually-acquired k-space values from the k-space data sets 1206a-d may replace corresponding k-space values of the first intermediate k-space 1426 ($K_n$) to generate 1407 the second intermediate k-space 1428 ($K_n'$). Thus, in some aspects, generating 1407 the second intermediate k-space 1428 ($K_n'$) can serve to guide the iterative technique 1400 to ultimately generate an output image 1420 ($I_{n+1}$) that accurately represent the object 1202 of interest. Following the generation 1407 of the second intermediate k-space 1428 ($K_n'$), the second intermediate k-space 1428 ($K_n'$) can be inverse Fourier transformed to generate 1409 the second intermediate image 1418 ($I_n'=I_{n+1}^{(2)}$).

Referring still to FIG. 14, according to the iterative technique 1400, the output image 1420 ($I_{n+1}$) is calculated 1411 by adding the product of a first weighting factor ($w_1$) and the first intermediate image 1416 ($I_{n+1}^{(1)}$) to the product of a second weighting factor ($w_2$) and the second intermediate image 1418 ($I_{n+1}^{(2)}$) (e.g., $I_{n+1}=w_1 I_{n+1}^{(1)}+w_2 I_{n+1}^{(2)}$). The sum of the first weighting factor ($w_1$) and the second weighting factor ($w_2$) is equal to 1 (e.g., $1=w_1+w_2$). The individual values of the first weighting factor ($w_1$) and the second weighting factor ($w_2$) can be selected to optimize the generation of the output image 1420 ($I_{n+1}$). For example, in some aspects, the first weighting factor ($w_1$) and the second weighting factor ($w_2$) can be selected so that the output image 1420 ($I_{n+1}$) is an average of the first intermediate image 1416 ($I_{n+1}^{(1)}$) and the second intermediate image 1418 ($I_{n+1}^{(2)}$) (e.g., $0.5=w_1=w_2$). In other aspects, the first weighting factor ($w_1$) and the second weighting factor ($w_2$) can be selected so that the output image 1420 ($I_{n+1}$) is weighted towards the first intermediate image 1416 ($I_{n+1}^{(1)}$) (e.g. $w_1>w_2$) or the first weighting factor ($w_1$) and the second weighting factor ($w_2$) can be selected so that the output image 1420 ($I_{n+1}$) is weighted towards the second intermediate image 1418 ($I_{n+1}^{(2)}$) (e.g. $w_2>w_1$).

Accordingly, the iterative technique 1400 can be implemented as part of the iterative technique 1300 (FIG. 13) and the method 1200 (FIG. 12) to generate images that accurately represent an object of interest in the field of view based on truncated, under-sampled k-space data sets, thereby enabling LF- and/or ULF MRI systems to achieve decreased acquisition times (e.g., compared to the acquisition times required for fully-sampled k-space data).

EXAMPLES

Various additional aspects of the subject matter described herein are set out in the following numbered examples:

Clause 1: A method for magnetic resonance imaging, the method comprising: receiving k-space data sets acquired by radiofrequency (RF) coils of a RF coil assembly, wherein each of the k-space data sets correspond to a different one of the RF coils, and wherein each of the k-space data sets are truncated and under sampled; generating partial images of a field of view based on the k-space data sets, wherein each of the partial images correspond to a different one of the k-space data sets; generating an initial image based on the partial images, wherein the initial image is full image of the field of view; and applying an iterative image reconstruction technique to generate an updated image based on the initial image, the iterative image reconstruction technique comprising: designating the initial image as an input image for the iterative image reconstruction technique; applying a phase correction to the input image to generate a first intermediate image; applying a k-space conjugate synthesis to the input image to generate a second intermediate image; calculating an output image based on the first intermediate image and the second intermediate image; designating the output image as the input image for a next iteration; and repeating the applying the phase correction to the input image, the applying the k-space conjugate synthesis to the input image, the calculating the output image, and the designating the output image as the input image for the next iteration, wherein the updated image is based on a final output image of the iterative image reconstruction technique.

Clause 2: The method of Clause 1, wherein the applying the phase correction to the input image, the applying the k-space conjugate synthesis to the input image, the calculating the output image, and the designating the output image as the input image for the next iteration is repeated until a difference between the output image and the corresponding input image satisfies a predetermined threshold.

Clause 3: The method of any of Claus 1-2, further comprising: receiving calibration k-space data sets acquired by the RF coils of the RF coil assembly, wherein each of the calibration k-space data sets correspond to a different one of the RF coils, and wherein each of the calibration k-space data sets comprises a central zone; and generate a phase map of the central zone based on the calibration k-space data sets.

Clause 4: The method of any of Clause 3, wherein applying the phase correction to the input image to generate the first intermediate image comprises: determining a magnitude of the input image; and calculating the first intermediate image based on the magnitude of the input image and the phase map of the central zone.

Clause 5: The method of any one of Clauses 1-4, wherein the k-space data sets comprise acquired k-space values, and wherein applying the k-space conjugate synthesis to the input image to generate the second intermediate image comprises: generating a first intermediate k-space by Fourier transforming the input image, wherein the first intermediate k-space comprises intermediate k-space values; generating a second intermediate k-space from the first intermediate k-space by replacing at least some of the intermediate k-space values with at least some of the acquired k-space values; and generating the second intermediate image by inverse Fourier transforming the second intermediate k-space.

Clause 6: The method of any one of Clauses 1-5, wherein calculating the output image based on the first intermediate image and the second intermediate image comprises: adding a product of the first intermediate image and a first weighting factor to a product of the second intermediate image and a second weighting factor; wherein a sum of the first weighting factor and the second weighting factor is equal to one.

Clause 7: The method of any one of Clauses 3-6, further comprising generating a coil sensitivity map based on the calibration k-space data sets.

Clause 8: The method of Clause 7, wherein the k-space data sets are acquired in parallel, and wherein generating the initial image based on the partial images comprises generating the initial image based on the partial images and the coil sensitivity map.

Clause 9: The method of Clause 8, wherein generating the initial image based on the partial images and the coil sensitivity map comprises generating the initial image according to a sensitivity encoding (SENSE) technique.

Clause 10: The method according to any one of Clauses 1-9, wherein each of the k-space data sets are under sampled based on an under-sampling rate of at least 2 in a first transverse direction and a second transverse direction, and wherein each of the k-space data sets are truncated by at least 37.5% in the first transverse direction and the second transverse direction.

Clause 11: The method according to any one of Clauses 1-10, wherein each of the k-space data sets are under sampled, truncated, and acquired in parallel such that a scan time required to acquire the k-space data sets is less than 10% of a scan time required to acquire a fully sampled, non-truncated k-space data set with a corresponding number of phase encodings.

Clause 12. A system, comprising: an array of magnets configured to generate a low-field strength or ultra-low-field strength magnetic field toward an object of interest located within a field of view; a radio frequency (RF) coil assembly comprising an array of RF coils, wherein the RF coils are positionable around an object of interest in the field of view, and wherein the RF coils are configured to acquire magnetic resonance signals; and a control circuit comprising a processor and a memory, wherein the memory stores instructions executable by the processor to: receive k-space data sets corresponding to magnetic resonance signals acquired by the RF coils, wherein each of the k-space data sets correspond to a different one of the RF coils, and wherein each of the k-space data sets are truncated and under sampled; generate partial images of the field of view based on the k-space data sets, wherein each of the partial images correspond to a different one of the k-space data sets; generate an initial image based on the partial images, wherein the initial image is full image of the field of view; and apply an iterative image reconstruction technique to generate an updated image based on the initial image.

Clause 13: The system of Clause 12, wherein the instructions executable by the processor to apply the iterative image reconstruction technique to generate the updated image comprise instructions to: designate the initial image as an input image for the iterative image reconstruction technique; apply a phase correction to the input image to generate a first intermediate image; apply a k-space conjugate synthesis to the input image to generate a second intermediate image; calculate an output image based on the first intermediate image and the second intermediate image;

designate the output image as the input image for a next iteration; and repeat the application of the phase correction to the input image, the application of the k-space conjugate synthesis to the input image, the calculation of the output image, and the designation of the output image as the input image for the next iteration until a difference between the output image and the corresponding input image satisfies a predetermined threshold, wherein the updated image is based on a final output image of the iterative image reconstruction technique.

Clause 14: The system of any one of Clauses 12-13, wherein the memory further stores instructions executable by the processor to: receive calibration k-space data sets corresponding to magnetic resonance signals acquired by the RF coils, wherein each of the calibration k-space data sets correspond to a different one of the RF coils, and wherein each of the calibration k-space data sets comprises a central zone; and generate a phase map of the central zone based on the calibration k-space data sets.

Clause 15: The system of Clause 14, wherein the instructions executable by the processor to apply the phase correction to the input image to generate the first intermediate image comprise instructions to: determine a magnitude of the input image; and calculate the first intermediate image based on the magnitude of the input image and the phase map of the central zone.

Clause 16: The system of Clause 15, wherein the memory further stores instructions executable by the processor to generate a coil sensitivity map based on the calibration k-space data sets.

Clause 17: The system of Clause 16, wherein the instructions executable by the processor to generate the initial image based on the partial images comprise instructions to generate the initial image based on the partial images and the coil sensitivity map.

Clause 18: The system of Clause 17, wherein the instructions executable by the processor to generate the initial image based on the partial images and the coil sensitivity map comprise instructions to generate the initial image according to a sensitivity encoding (SENSE) technique.

Clause 19: The system of any one of Clauses 13-18, wherein the k-space data sets comprise acquired k-space values, and wherein the instructions executable by the processor to apply the k-space conjugate synthesis to the input image to generate the second intermediate image comprise instructions to: generate a first intermediate k-space by inverse Fourier transforming the input image, wherein the first intermediate k-space comprises intermediate k-space values; generate a second intermediate k-space from the first intermediate k-space by replacing at least some of the intermediate k-space values with at least some of the acquired k-space values; and generate the second intermediate image by Fourier transforming the second intermediate k-space.

Clause 20: The system any one of Clauses 13-19, wherein the instructions executable by the processor to calculate the output image based on the first intermediate image and the second intermediate image comprise instructions to: add a product of the first intermediate image and a first weighting factor to a product of the second intermediate image and a second weighting factor; wherein a sum of the first weighting factor and the second weighting factor is equal to one.

Clause 21: The system according to any one of Clauses 12-20, wherein each of the k-space data sets are under sampled based on an under-sampling rate of at least 2 in a first transverse direction and a second transverse direction, and wherein each of the k-space data sets are truncated by at least 37.5% in the first transverse direction and the second transverse direction.

While several forms have been illustrated and described, it is not the intention of Applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, and/or examples can be implemented, individually and/or collectively, by a wide range of hardware, software, firmware, or virtually any combination thereof. Those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as one or more program products in a variety of forms, and that an illustrative form of the subject matter described herein applies regardless of the particular type of signal bearing medium used to actually carry out the distribution.

Instructions used to program logic to perform various disclosed aspects can be stored within a memory in the system, such as dynamic random access memory (DRAM), cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, compact disc, read-only memory (CD-ROMs), and magneto-optical disks, read-only memory (ROMs), random access memory (RAM), erasable programmable read-only memory (EPROM), electrically erasable programmable read-only memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the non-transitory computer-readable medium includes any type of tangible machine-readable medium suitable for storing or transmitting electronic instructions or information in a form readable by a machine (e.g., a computer).

As used in any aspect herein, the term "control circuit" may refer to, for example, hardwired circuitry, programmable circuitry (e.g., a computer processor including one or more individual instruction processing cores, processing unit, processor, microcontroller, microcontroller unit, controller, digital signal processor (DSP), programmable logic device (PLD), programmable logic array (PLA), or field programmable gate array (FPGA)), state machine circuitry, firmware that stores instructions executed by programmable circuitry, and any combination thereof. The control circuit may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Accordingly, as used herein "control circuit" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

As used in any aspect herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

As used in any aspect herein, the terms "component," "system," "module" and the like can refer to a control circuit computer-related entity, either hardware, a combination of hardware and software, software, or software in execution.

As used in any aspect herein, an "algorithm" refers to a self-consistent sequence of steps leading to a desired result, where a "step" refers to a manipulation of physical quantities and/or logic states which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities and/or states.

A network may include a packet switched network. The communication devices may be capable of communicating with each other using a selected packet switched network communications protocol. One example communications protocol may include an Ethernet communications protocol which may be capable permitting communication using a Transmission Control Protocol/Internet Protocol (TCP/IP). The Ethernet protocol may comply or be compatible with the Ethernet standard published by the Institute of Electrical and Electronics Engineers (IEEE) titled "IEEE 802.3 Standard", published in December, 2008 and/or later versions of this standard. Alternatively or additionally, the communication devices may be capable of communicating with each other using an X.25 communications protocol. The X.25 communications protocol may comply or be compatible with a standard promulgated by the International Telecommunication Union-Telecommunication Standardization Sector (ITU-T). Alternatively or additionally, the communication devices may be capable of communicating with each other using a frame relay communications protocol. The frame relay communications protocol may comply or be compatible with a standard promulgated by Consultative Committee for International Telegraph and Telephone (CCITT) and/or the American National Standards Institute (ANSI). Alternatively or additionally, the transceivers may be capable of communicating with each other using an Asynchronous Transfer Mode (ATM) communications protocol. The ATM communications protocol may comply or be compatible with an ATM standard published by the ATM Forum titled "ATM-MPLS Network Interworking 2.0" published August 2001, and/or later versions of this standard. Of course, different and/or after-developed connection-oriented network communication protocols are equally contemplated herein.

Unless specifically stated otherwise as apparent from the foregoing disclosure, it is appreciated that, throughout the foregoing disclosure, discussions using terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

One or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

The terms "proximal" and "distal" are used herein with reference to a clinician manipulating the handle portion of the surgical instrument. The term "proximal" refers to the portion closest to the clinician and the term "distal" refers to the portion located away from the clinician. It will be further appreciated that, for convenience and clarity, spatial terms such as "vertical", "horizontal", "up", and "down" may be used herein with respect to the drawings. However, surgical instruments are used in many orientations and positions, and these terms are not intended to be limiting and/or absolute.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flow diagrams are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect. Furthermore, the particular features, structures or characteristics may be combined in any suitable manner in one or more aspects.

Any patent application, patent, non-patent publication, or other disclosure material referred to in this specification and/or listed in any Application Data Sheet is incorporated by reference herein, to the extent that the incorporated materials is not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

What is claimed is:

1. A method for magnetic resonance imaging, the method comprising:
   receiving k-space data sets acquired by radiofrequency (RF) coils of a RF coil assembly, wherein each of the k-space data sets correspond to a different one of the RF coils, and wherein each of the k-space data sets are truncated and under sampled;
   receiving calibration k-space data sets acquired by the RF coils of the RF coil assembly, wherein each of the calibration k-space data sets correspond to a different one of the RF coils, and wherein each of the calibration k-space data sets comprises a central zone;
   generate a phase map of the central zone based on the calibration k-space data sets;
   generating partial images of a field of view based on the k-space data sets, wherein each of the partial images correspond to a different one of the k-space data sets;
   generating an initial image based on the partial images, wherein the initial image is full image of the field of view; and
   applying an iterative image reconstruction technique to generate an updated image based on the initial image, the iterative image reconstruction technique comprising:
      designating the initial image as an input image for the iterative image reconstruction technique;
      applying a phase correction to the input image to generate a first intermediate image;
      applying a k-space conjugate synthesis to the input image to generate a second intermediate image;
      calculating an output image based on the first intermediate image and the second intermediate image;
      designating the output image as the input image for a next iteration; and
      repeating the applying the phase correction to the input image, the applying the k-space conjugate synthesis to the input image, the calculating the output image, and the designating the output image as the input image for the next iteration, wherein the updated image is based on a final output image of the iterative image reconstruction technique.

2. A system, comprising:

an array of magnets configured to generate a low-field strength or ultra-low-field strength magnetic field toward an object of interest located within a field of view;

a radio frequency (RF) coil assembly comprising an array of RF coils, wherein the RF coils are positionable around an object of interest in the field of view, and wherein the RF coils are configured to acquire magnetic resonance signals; and a control circuit comprising a processor and a memory, wherein the memory stores instructions executable by the processor to:

receive k-space data sets corresponding to magnetic resonance signals acquired by the RF coils, wherein each of the k-space data sets correspond to a different one of the RF coils, and wherein each of the k-space data sets are truncated and under sampled;

generate partial images of the field of view based on the k-space data sets, wherein each of the partial images correspond to a different one of the k-space data sets;

generate an initial image based on the partial images, wherein the initial image is full image of the field of view;

apply an iterative image reconstruction technique to generate an updated image based on the initial image;

wherein the instructions executable by the processor to apply the iterative image reconstruction technique to generate the updated image comprise instructions to:

designate the initial image as an input image for the iterative image reconstruction technique;

apply a phase correction to the input image to generate a first intermediate image;

apply a k-space conjugate synthesis to the input image to generate a second intermediate image;

calculate an output image based on the first intermediate image and the second intermediate image;

designate the output image as the input image for a next iteration; and repeat the application of the phase correction to the input image, the application of the k-space conjugate synthesis to the input image, the calculation of the output image, and the designation of the output image as the input image for the next iteration until a difference between the output image and the corresponding input image satisfies a predetermined threshold, wherein the updated image is based on a final output image of the iterative image reconstruction technique.

3. The method of claim 1, wherein the applying the phase correction to the input image, the applying the k-space conjugate synthesis to the input image, the calculating the output image, and the designating the output image as the input image for the next iteration is repeated until a difference between the output image and the corresponding input image satisfies a predetermined threshold.

4. The method of claim 1, wherein applying the phase correction to the input image to generate the first intermediate image comprises:

determining a magnitude of the input image; and calculating the first intermediate image based on the magnitude of the input image and the phase map of the central zone.

5. The method of claim 1, wherein each of the k-space data sets are under sampled based on an under-sampling rate of at least 2 in a first transverse direction and a second transverse direction, and wherein each of the k-space data sets are truncated by at least 37.5% in the first transverse direction and the second transverse direction.

6. The method of claim 1, wherein each of the k-space data sets are under sampled, truncated, and acquired in parallel such that a scan time required to acquire the k-space data sets is less than 10% of a scan time required to acquire a fully sampled, non-truncated k-space data set with a corresponding number of phase encodings.

7. The system of claim 2, wherein the memory further stores instructions executable by the processor to:

receive calibration k-space data sets corresponding to magnetic resonance signals acquired by the RF coils, wherein each of the calibration k-space data sets correspond to a different one of the RF coils, and wherein each of the calibration k-space data sets comprises a central zone; and generate a phase map of the central zone based on the calibration k-space data sets.

8. The system of claim 2, wherein the k-space data sets comprise acquired k-space values, and wherein the instructions executable by the processor to apply the k-space conjugate synthesis to the input image to generate the second intermediate image comprise instructions to:

generate a first intermediate k-space by inverse Fourier transforming the input image, wherein the first intermediate k-space comprises intermediate k-space values;

generate a second intermediate k-space from the first intermediate k-space by replacing at least some of the intermediate k-space values with at least some of the acquired k-space values; and generate the second intermediate image by Fourier transforming the second intermediate k-space.

9. The system of claim 2, wherein the instructions executable by the processor to calculate the output image based on the first intermediate image and the second intermediate image comprise instructions to:

add a product of the first intermediate image and a first weighting factor to a product of the second intermediate image and a second weighting factor;

wherein a sum of the first weighting factor and the second weighting factor is equal to one.

10. The system of claim 2, wherein each of the k-space data sets are under sampled based on an under-sampling rate of at least 2 in a first transverse direction and a second transverse direction, and wherein each of the k-space data sets are truncated by at least 37.5% in the first transverse direction and the second transverse direction.

11. The method of claim 4, wherein the k-space data sets comprise acquired k-space values, and wherein applying the k-space conjugate synthesis to the input image to generate the second intermediate image comprises:

generating a first intermediate k-space by Fourier transforming the input image, wherein the first intermediate k-space comprises intermediate k-space values;

generating a second intermediate k-space from the first intermediate k-space by replacing at least some of the intermediate k-space values with at least some of the acquired k-space values; and generating the second intermediate image by inverse Fourier transforming the second intermediate k-space.

12. The system of claim 7, wherein the instructions executable by the processor to apply the phase correction to the input image to generate the first intermediate image comprise instructions to:

determine a magnitude of the input image; and calculate the first intermediate image based on the magnitude of the input image and the phase map of the central zone.

13. The method of claim 11, wherein calculating the output image based on the first intermediate image and the second intermediate image comprises:

adding a product of the first intermediate image and a first weighting factor to a product of the second intermediate image and a second weighting factor;

wherein a sum of the first weighting factor and the second weighting factor is equal to one.

14. The system of claim 12, wherein the memory further stores instructions executable by the processor to generate a coil sensitivity map based on the calibration k-space data sets.

15. The method of claim 13, further comprising generating a coil sensitivity map based on the calibration k-space data sets.

16. The system of claim 14, wherein the instructions executable by the processor to generate the initial image based on the partial images comprise instructions to generate the initial image based on the partial images and the coil sensitivity map.

17. The method of claim 15, wherein the k-space data sets are acquired in parallel, and wherein generating the initial image based on the partial images comprises generating the initial image based on the partial images and the coil sensitivity map.

18. The system of claim 16, wherein the instructions executable by the processor to generate the initial image based on the partial images and the coil sensitivity map comprise instructions to generate the initial image according to a sensitivity encoding (SENSE) technique.

19. The method of claim 17, wherein generating the initial image based on the partial images and the coil sensitivity map comprises generating the initial image according to a sensitivity encoding (SENSE) technique.

* * * * *